(12) United States Patent
Kim

(10) Patent No.: US 11,075,111 B2
(45) Date of Patent: Jul. 27, 2021

(54) VERTICAL SEMICONDUCTOR DEVICE AND METHOD FOR FABRICATING THE SAME

(71) Applicant: SK hynix Inc., Icheon (KR)

(72) Inventor: Jong-Hoon Kim, Yongin (KR)

(73) Assignee: SK hynix Inc., Icheon (KR)

( * ) Notice: Subject to any disclaimer, the term of this patent is extended or adjusted under 35 U.S.C. 154(b) by 79 days.

(21) Appl. No.: 16/683,132

(22) Filed: Nov. 13, 2019

(65) Prior Publication Data

US 2021/0028058 A1 Jan. 28, 2021

(30) Foreign Application Priority Data

Jul. 26, 2019 (KR) ........................ 10-2019-0091072

(51) Int. Cl.
*H01L 21/768* (2006.01)
*H01L 27/11556* (2017.01)
*H01L 27/11582* (2017.01)

(52) U.S. Cl.
CPC .. *H01L 21/76802* (2013.01); *H01L 21/76877* (2013.01); *H01L 27/11556* (2013.01); *H01L 27/11582* (2013.01)

(58) Field of Classification Search
CPC ......... H01L 21/76802; H01L 21/76877; H01L 27/11582; H01L 27/11556; H01L 27/11573; H01L 27/11565
USPC ........................................................ 438/613
See application file for complete search history.

(56) References Cited

U.S. PATENT DOCUMENTS

| | | |
|---|---|---|
| 9,985,046 B2 | 5/2018 | Lu et al. |
| 10,115,632 B1 | 10/2018 | Masamori et al. |
| 2020/0027894 A1* | 1/2020 | Son .................... H01L 27/11556 |
| 2020/0075627 A1* | 3/2020 | Ahn .................... H01L 21/31144 |

* cited by examiner

*Primary Examiner* — Caleen O Sullivan

(57) ABSTRACT

A method for fabricating a semiconductor device includes preparing a substrate including a first region and a second region, forming a lower alternating stack on the substrate; etching the lower alternating stack to form a lower opening in the second region, forming an upper alternating stack on the lower opening and the lower alternating stack to form recess portion caused by filling the lower opening in the second region, forming a mask layer on the upper alternating stack using the recess portion as an alignment key, and etching the upper alternating stack by using the mask layer as a barrier to form a pattern in the first region.

17 Claims, 25 Drawing Sheets

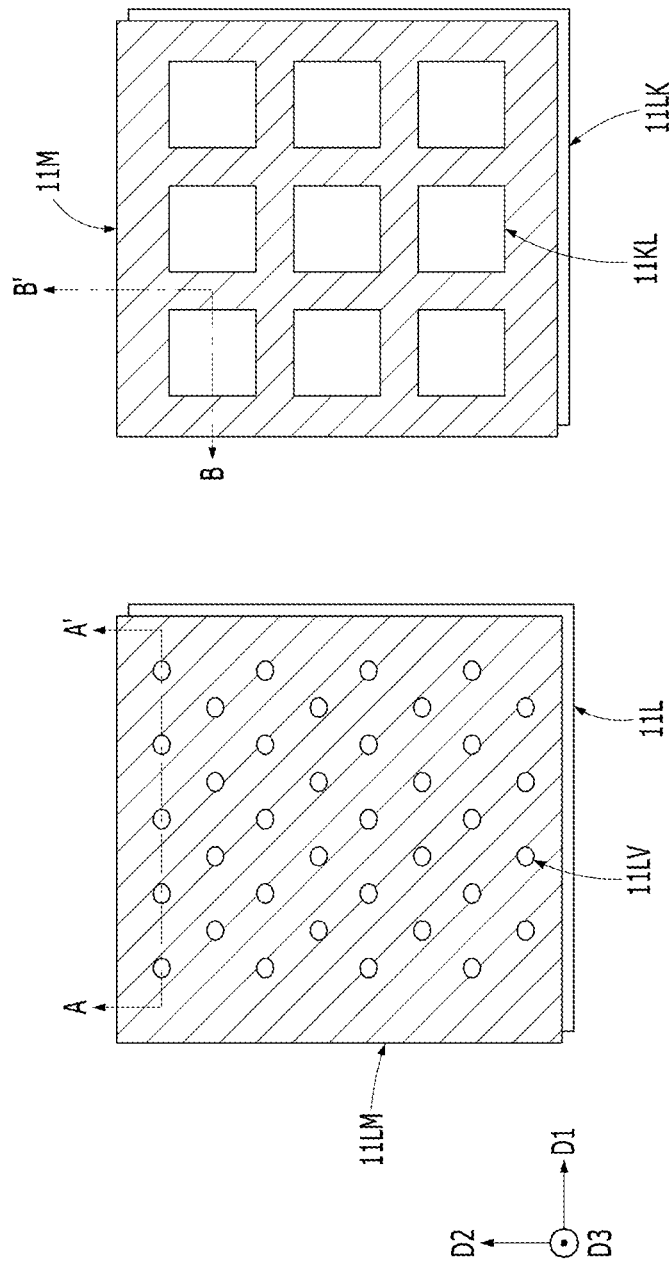

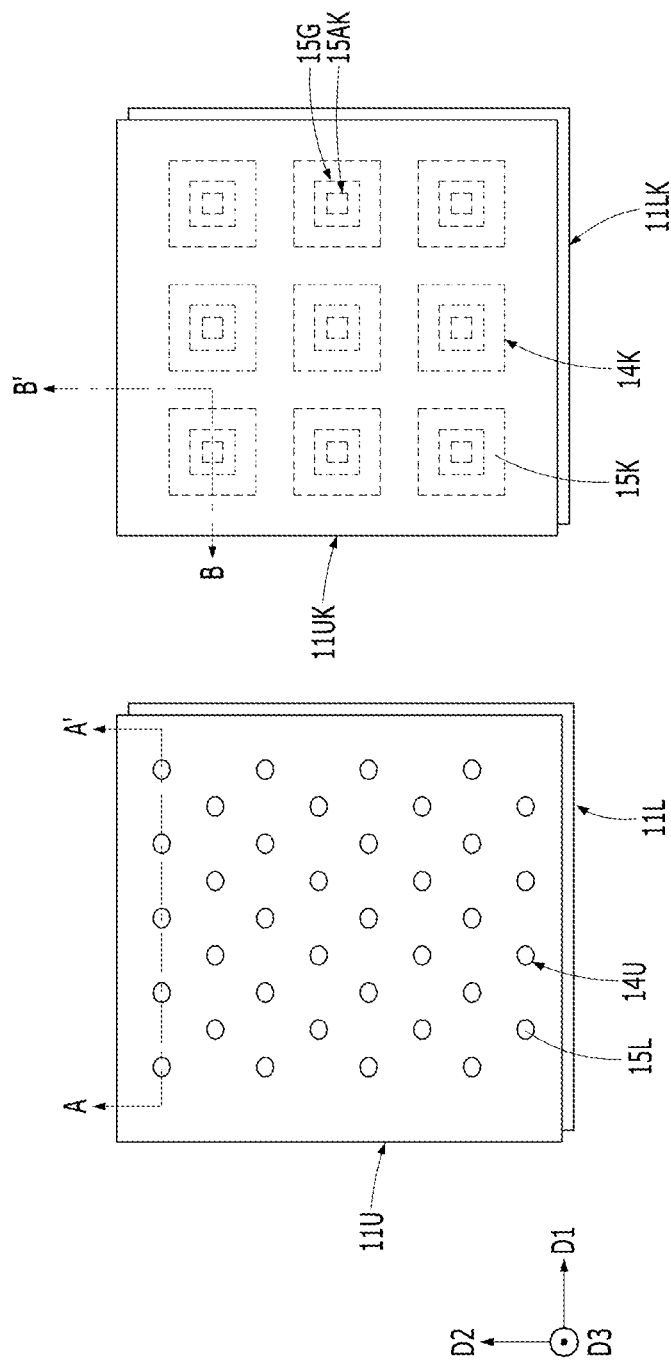

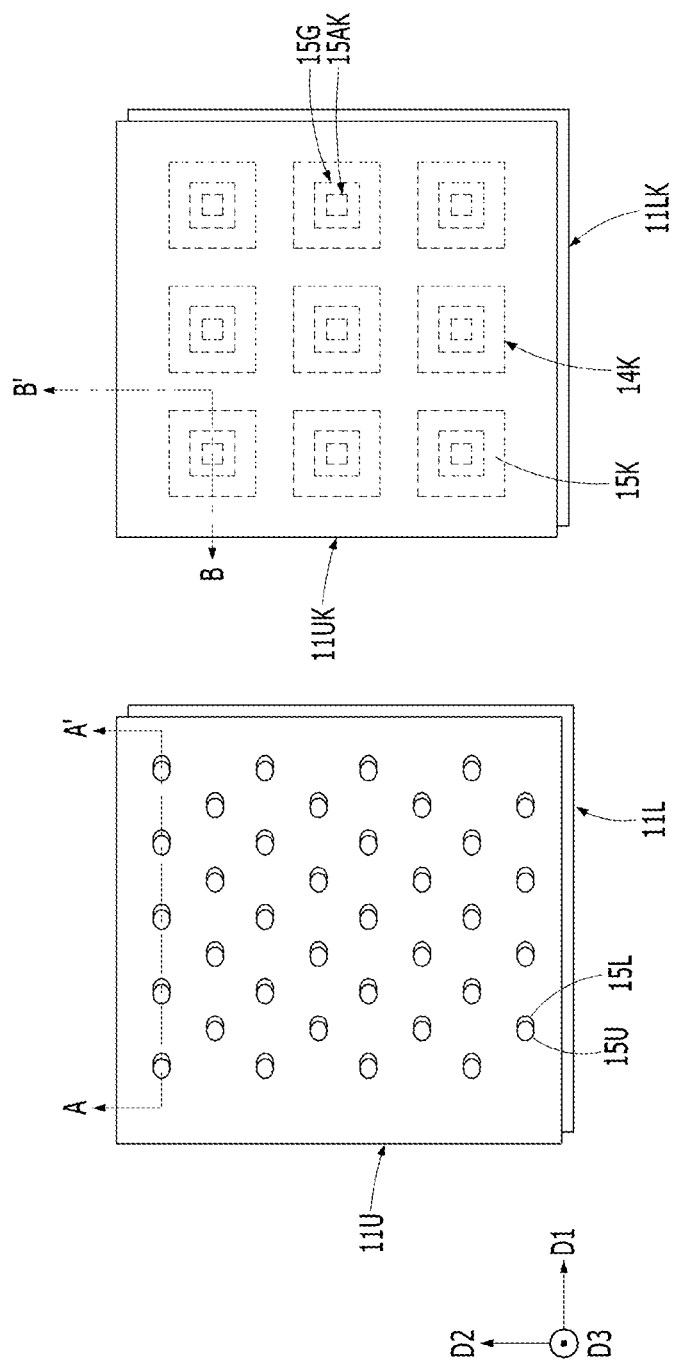

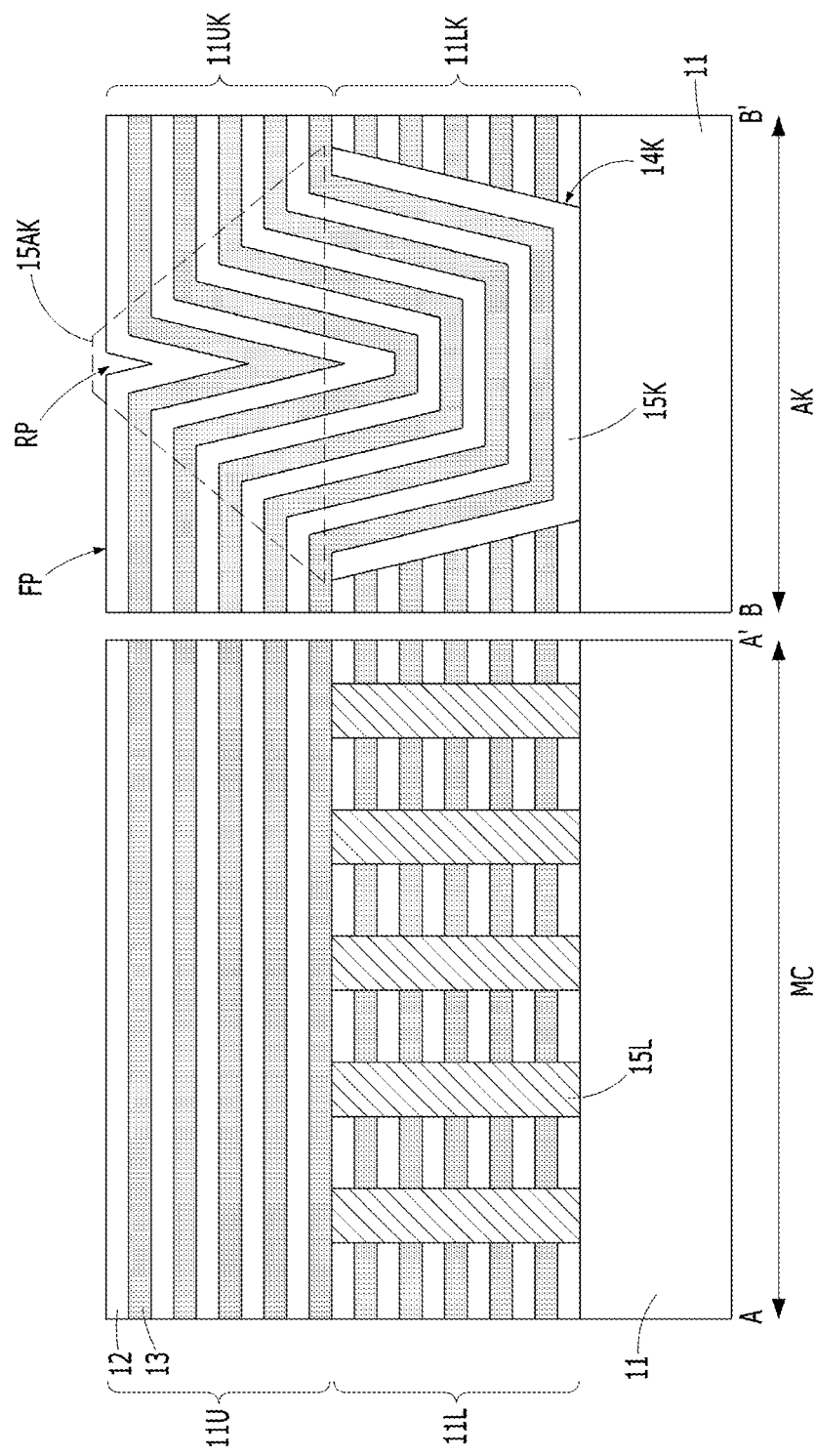

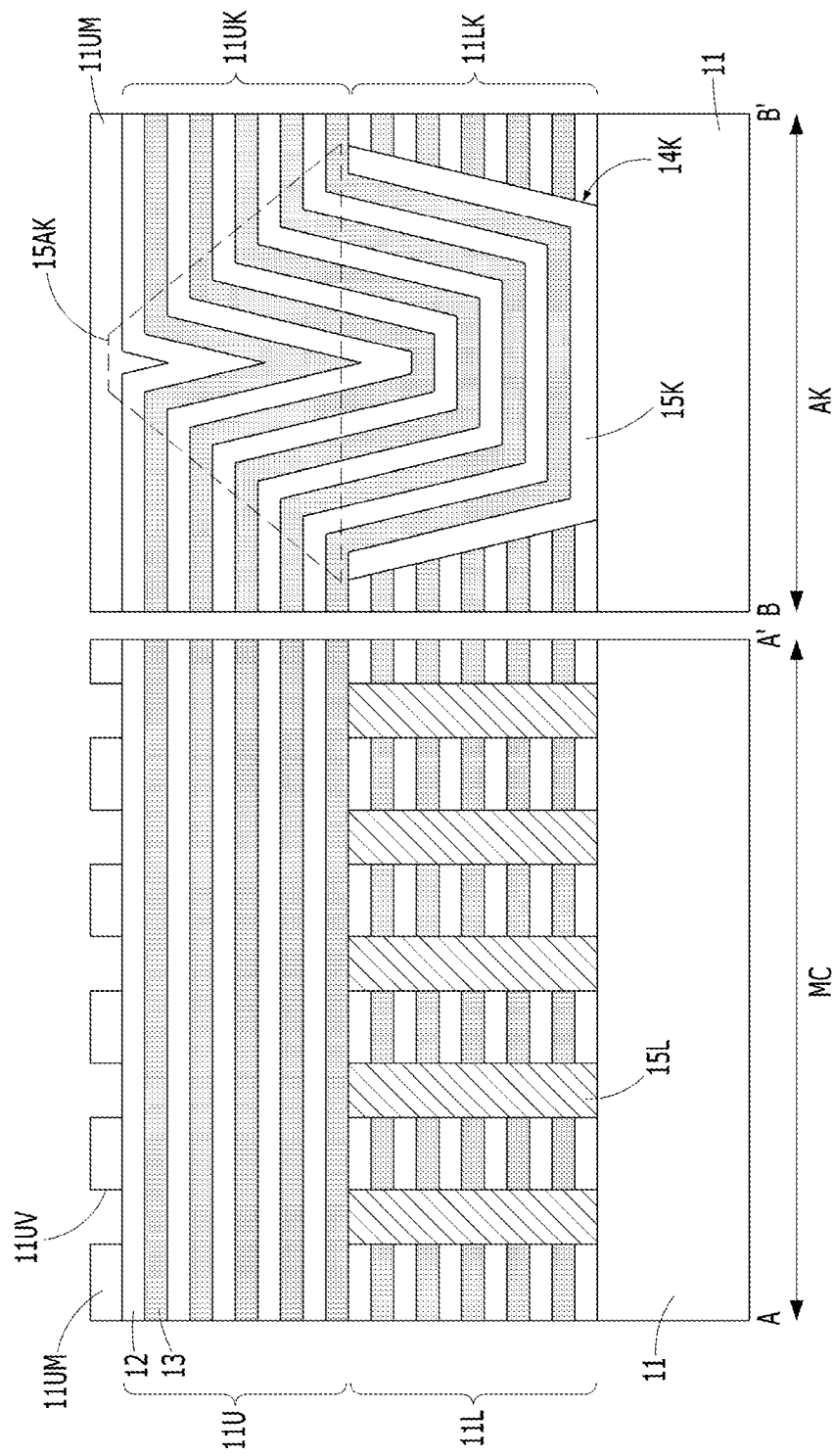

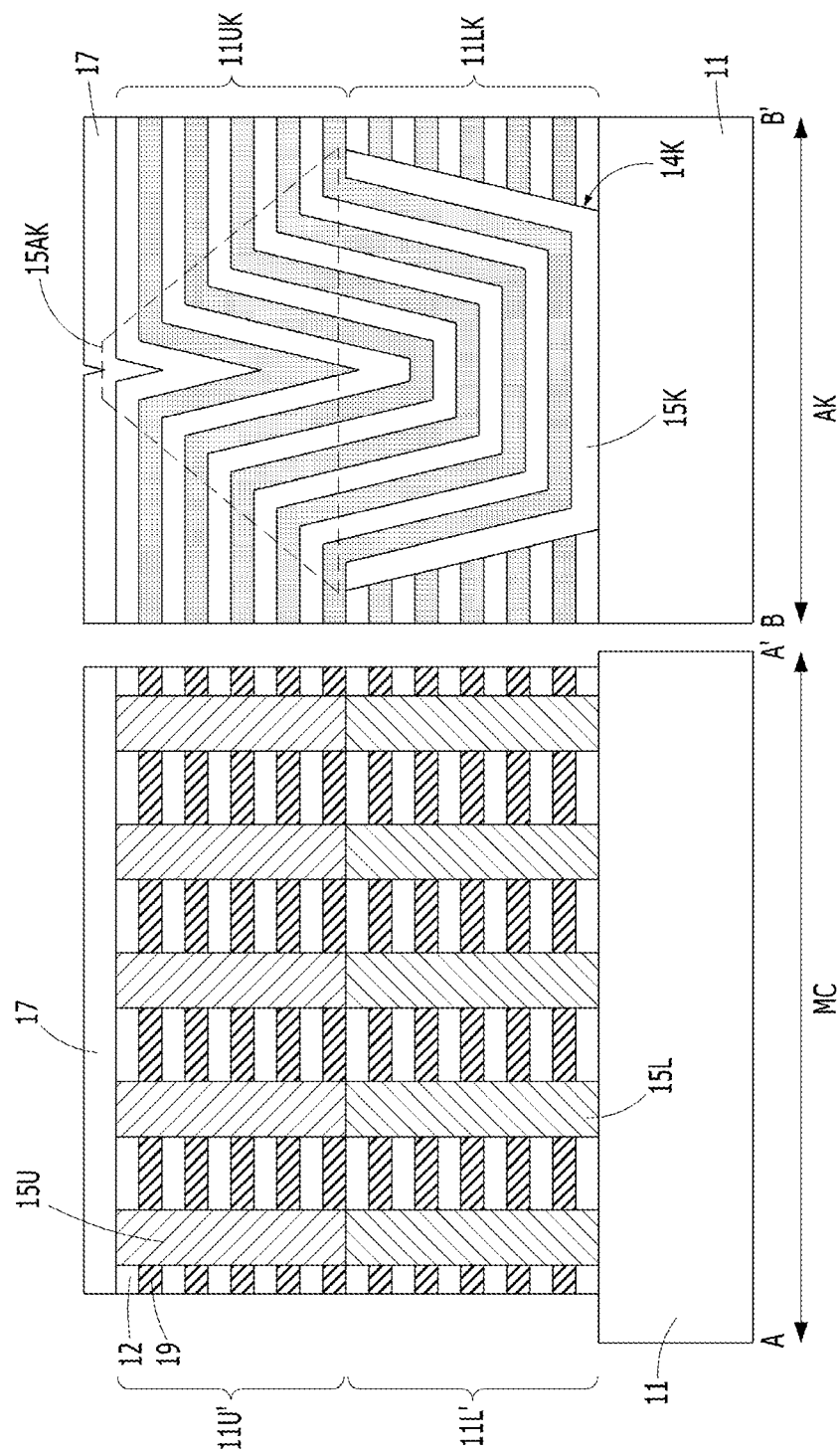

VERTICAL SEMICONDUCTOR DEVICE AND METHOD FOR FABRICATING THE SAME

CROSS-REFERENCE TO RELATED APPLICATIONS

The present application claims priority to Korean Patent Application No. 10-2019-0091072, filed on Jul. 26, 2019, which is incorporated herein by reference in its entirety.

BACKGROUND

1. Field

Exemplary embodiments relate to a semiconductor device, and more particularly, to a vertical semiconductor device and a method for fabricating the same.

2. Description of the Related Art

A semiconductor device may include a memory cell array having a plurality of memory cells. The memory cell array may include memory cells disposed in various structures. In order to improve the degree of integration of a semiconductor device, the memory cells may be arranged in three dimensions (3D) on a substrate.

SUMMARY

Exemplary embodiments of the present disclosure are directed to a vertical semiconductor device that improves overlay accuracy and a method for fabricating the same.

In accordance with an embodiment, a method for fabricating a vertical semiconductor device may include preparing a substrate including a first region and a second region; forming a lower alternating stack on the substrate; etching the lower alternating stack to form a lower opening in the second region; forming an upper alternating stack on the lower opening and the lower alternating stack to form recess portion caused by filling the lower opening in the second region; forming a mask layer on the upper alternating stack using the recess portion as an alignment key; and etching the upper alternating stack by using the mask layer as a barrier to form a pattern in the first region.

In accordance with an embodiment, a method for fabricating a vertical semiconductor device may include preparing a substrate including a first region and a second region; forming a lower alternating stack in which first dielectric layers and first sacrificial layers are alternately stacked on the substrate; etching the lower alternating stack to form a lower hole located in the first region and a lower opening located in the second region; forming a lower pillar structure in the lower hole; forming an upper alternating stack in which second dielectric layers and second sacrificial layers are alternately stacked on the lower opening to form a recess portion caused by filling the lower opening; forming a mask layer on the upper alternating stack using the recess portion; etching the upper alternating stack using the mask layer as a barrier to form an upper hole that exposes the lower pillar structure in the first region; forming an upper pillar structure in the upper hole; and replacing the first and second sacrificial layers with gate electrodes.

In accordance with an embodiment, a vertical semiconductor device may include: a substrate including a memory cell region and an alignment key region; a memory cell stack in which dielectric layers and gate electrodes are alternately stacked in the memory cell region; a dummy stack formed in the alignment key region; a lower channel structure that penetrates a lower portion of the memory cell stack; an upper channel structure that penetrates an upper portion of the memory cell stack and is located on the lower channel structure; a lower stepped alignment key having a trench shape and disposed in a lower portion of the dummy stack; and an upper stepped alignment key disposed in an upper portion of the dummy stack and caused by the lower stepped alignment key.

In accordance with an embodiment, a method for fabricating a vertical semiconductor device may include preparing a substrate including a first region and a second region; forming a lower alternating stack on the substrate; etching the lower alternating stack to form a first hole array located in the first region and a second hole array located in the second region; forming a lower pillar array in the first hole array; forming an upper alternating stack on the second hole array to form a recess portion caused by filling the second hole array; forming a mask layer on the upper alternating stack using the recess portion as an alignment key; etching the upper alternating stack using the mask layer as a barrier to form a third hole array that exposes the lower pillar array in the first region; and forming an upper pillar array in the third hole array.

In accordance with an embodiment, a method for fabricating a vertical semiconductor device may include: preparing a substrate including a first region and a second region; forming a lower alternating stack on the substrate; etching the lower alternating stack to form a lower step in the second region; forming an upper alternating stack on the lower step and the lower alternating stack to form an upper step induced from the lower step in the second region; forming a mask layer on the upper alternating stack by using the upper step as an alignment key; and etching the upper alternating stack by using the mask layer as a barrier to form a pattern in the first region.

BRIEF DESCRIPTION OF THE DRAWINGS

FIGS. 3A-3K are plan views and FIGS. 4A to 4K are cross sectional views that illustrate a vertical semiconductor device in accordance with an embodiment.

DETAILED DESCRIPTION

Various examples and embodiments described herein will be described with reference to cross-sectional views, plan views and block diagrams, which are ideal schematic views of the present disclosure. Thus, the shape of the illustrations may be modified by fabricating techniques and/or tolerances. Accordingly, the embodiments of the present disclosure are not limited to the specific forms shown, but also include changes in the shapes that are generated according to the fabricating process. The regions illustrated in the figures have schematic attributes, and the shapes of the regions illustrated in the figures are intended to illustrate specific types of regions of the elements and are not intended to limit the scope of the disclosure. The illustrations are not drawn to scale, and features may be exaggerated for the sake of clarity.

According to embodiments described below, an alignment key is formed by filling an opening so that a notch is propagated to an upper surface, thereby improving alignment and etching when forming upper pillar structures that are aligned with lower pillar structures. Alignment keys formed in the alignment key region are formed in a stepped shape, and the stepped alignment key may include a plurality of closed portions and a plurality of opened portions. Such the stepped alignment key can prevent cracking and arcing of the alignment keys. The stepped alignment keys may be used for accurate overlay control of a photomask, and an alignment key signal may be obtained using the stepped alignment keys.

Figure 1:
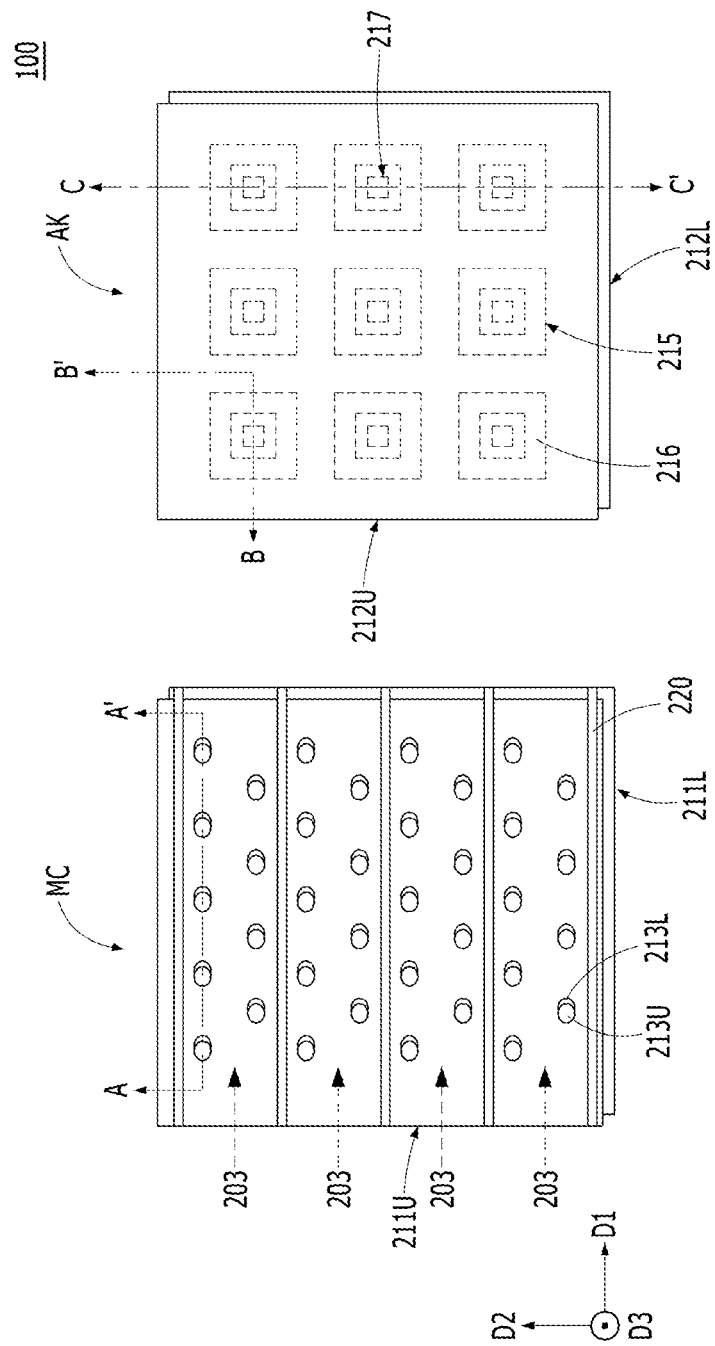
FIG. 1 is a plan view illustrating a vertical semiconductor device in accordance with an embodiment.
Figure 2A:
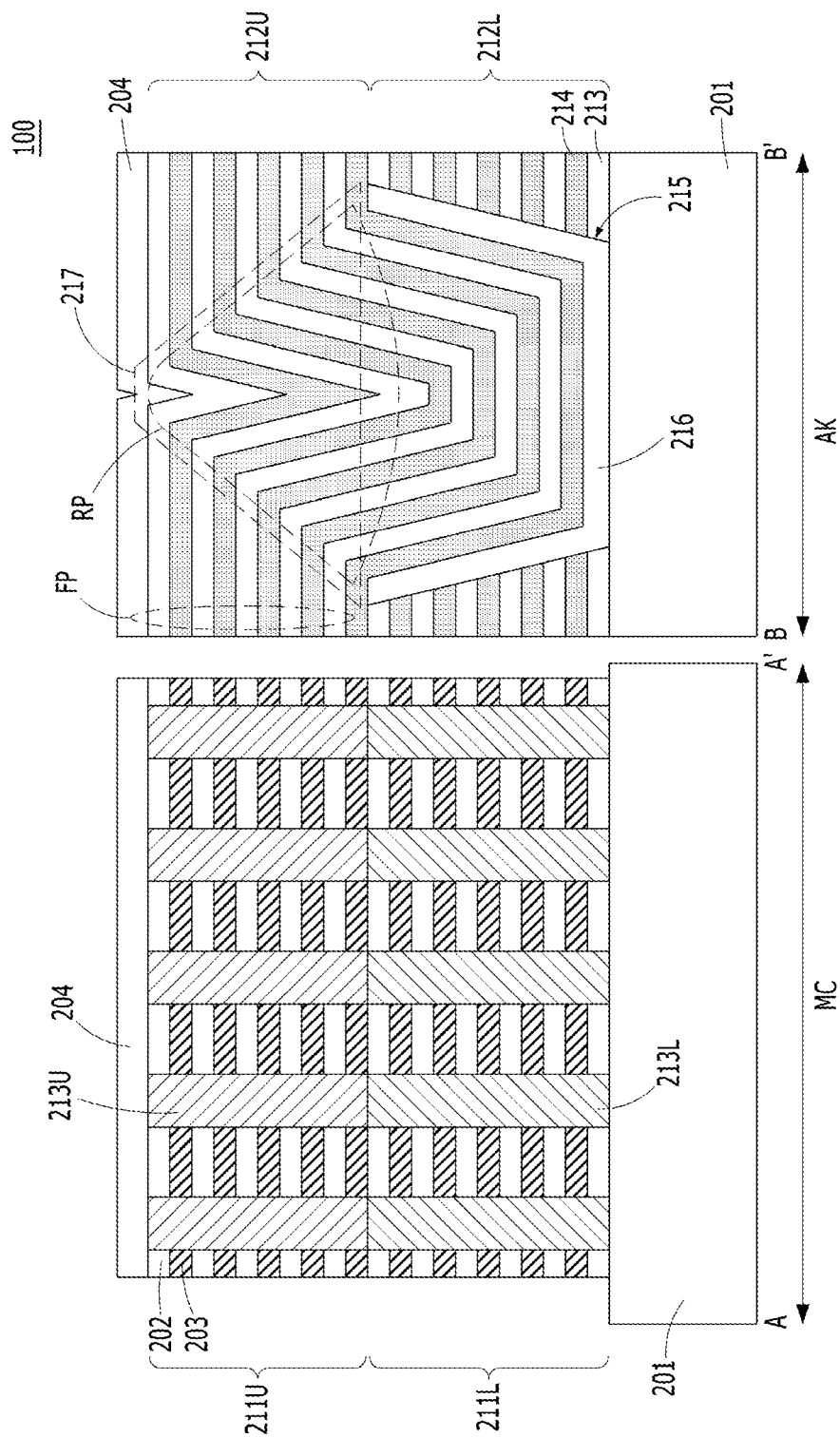
FIG. 2A is a cross-sectional view illustrating the vertical semiconductor device taken along A-A' and B-B' lines illustrated in FIG. 1.
Figure 2B:
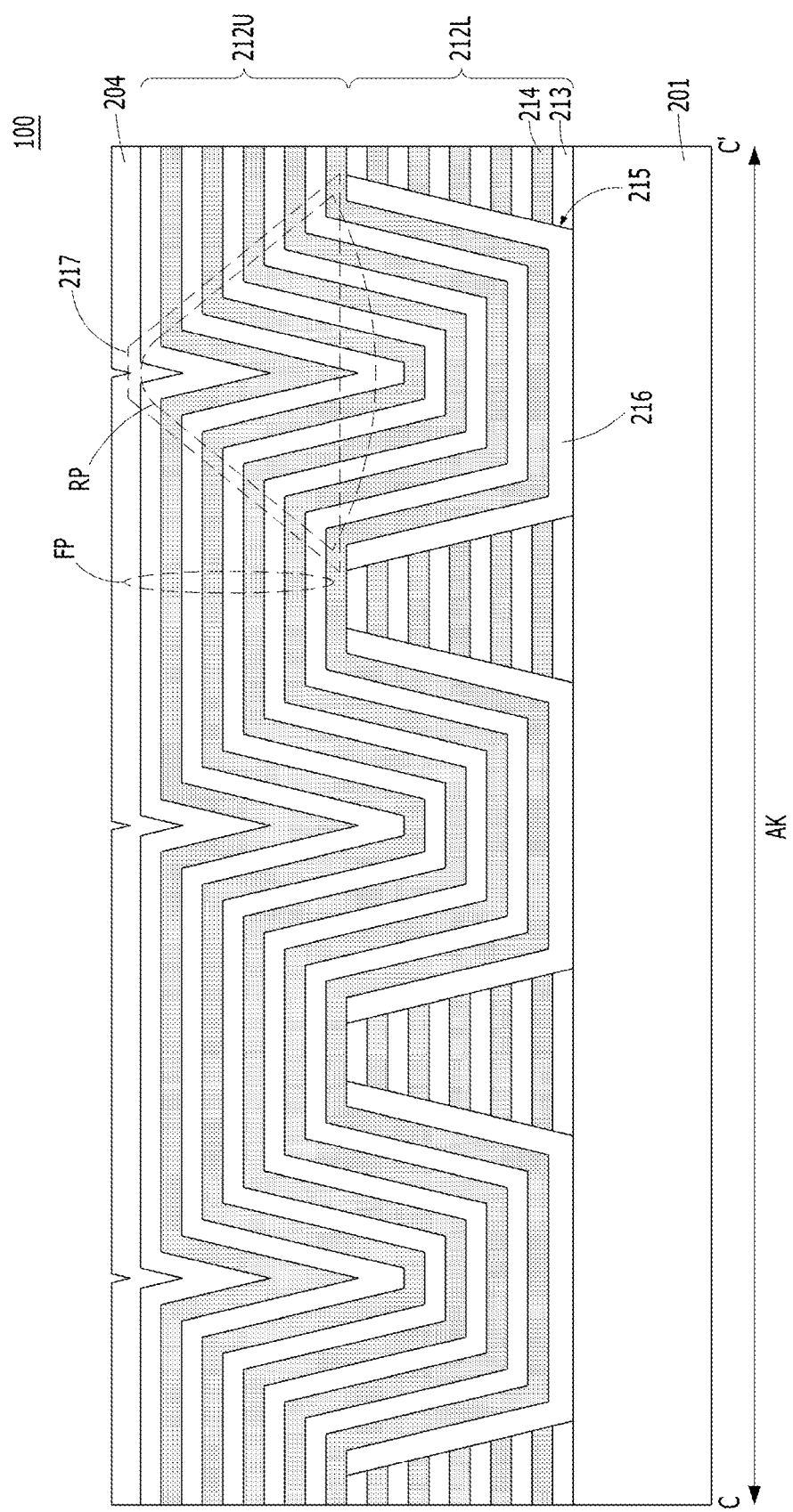
FIG. 2B is a cross-sectional view illustrating the vertical semiconductor device taken along a C-C' line illustrated in FIG. 1.

FIG. 1 is a plan view illustrating a vertical semiconductor device 100 in accordance with an embodiment. FIG. 2A is a cross-sectional view illustrating the vertical semiconductor device 100 taken along lines A-A' and B-B' illustrated in FIG. 1. FIG. 2B is a cross-sectional view illustrating the vertical semiconductor device 100 taken along line C-C' illustrated in FIG. 1.

Referring to FIGS. 1 to 2B, the vertical semiconductor device 100 may include a substrate 201, memory cell stacks 211L and 211U in which dielectric layers 202 and gate electrodes 203 are alternately stacked on the substrate 201 and pillar structures 213L and 213U that penetrate the memory cell stacks 211L and 211U. The pillar structures 213L and 213U may have pillar shapes that fills openings penetrating the memory cell stacks 211L and 211U. The memory cell stacks 211L and 211U and the pillar structures 213L and 213U may be formed in a memory cell region MC.

The substrate 201 may be a material suitable for semiconductor processing. The substrate 201 may include a semiconductor substrate. For example, the substrate 201 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate or similar combined materials, which may be combined in a single layer or in multiple layers. The substrate 201 may include a semiconductor material other than silicon, such as germanium. The substrate 201 may include an III/V-group semiconductor substrate, for example, a chemical compound semiconductor substrate such as a gallium arsenide (GaAs). The substrate 201 may include a Silicon-On-Insulator (SOI) substrate. The substrate 201 may include a memory cell region MC and an alignment key region AK.

The memory cell stacks 211L and 211U may include a lower memory cell stack 211L and an upper memory cell stack 211U. The upper memory cell stack 211U may be located on and aligned with the lower memory cell stack 211L. The lower and upper memory cell stacks 211L and 211U may have a structure in which the dielectric layers 202 and the gate electrodes 203 are alternately stacked. The memory cell stacks 211L and 211U may be divided into discreet blocks by a slit 220.

The pillar structures 213L and 213U may include a stack of a lower pillar structure 213L and an upper pillar structure 213U. The lower pillar structure 213L may penetrate the lower memory cell stack 211L, and the upper pillar structure 213U may penetrate the upper memory cell stack 211U.

Figure 4A:
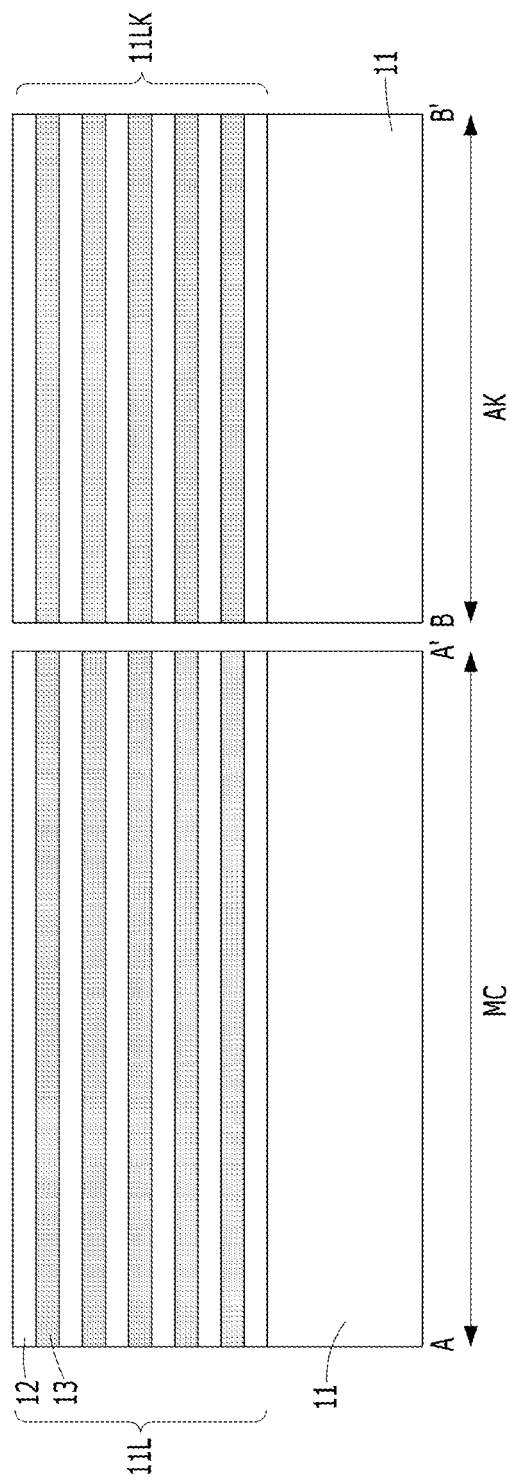
Figure 4B:
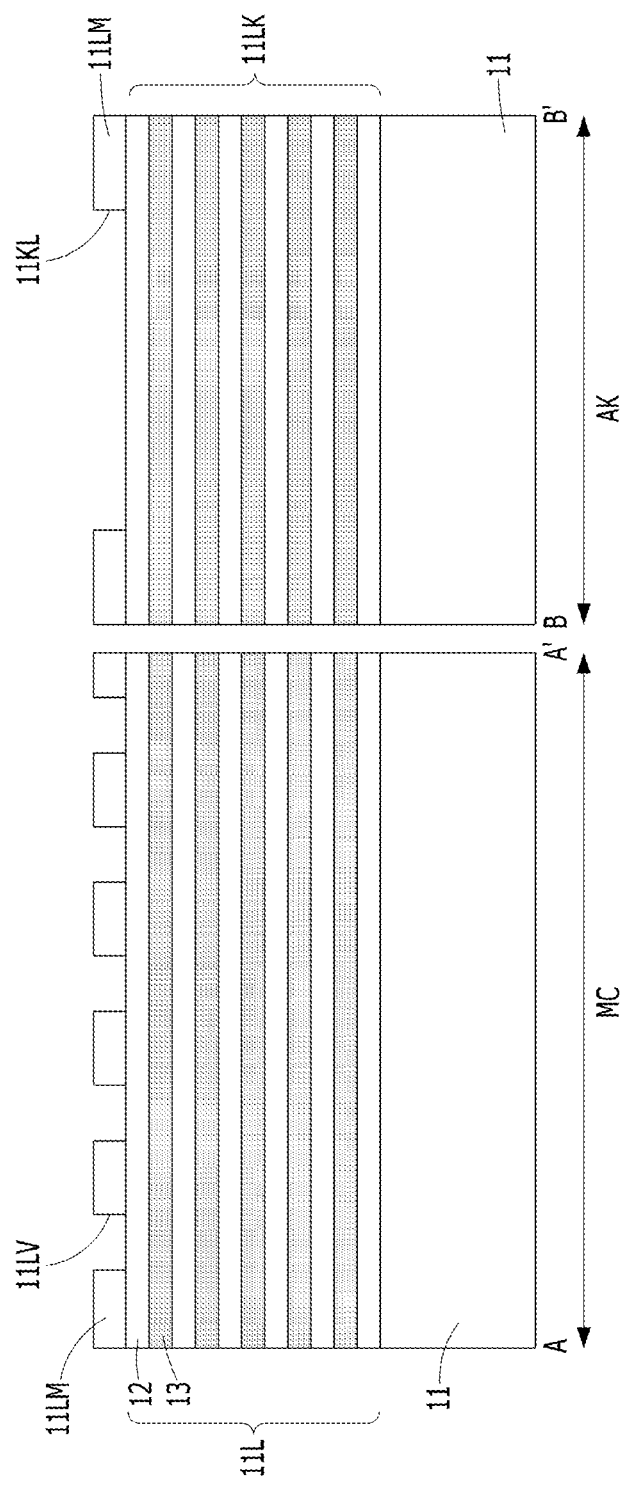
Figure 4C:
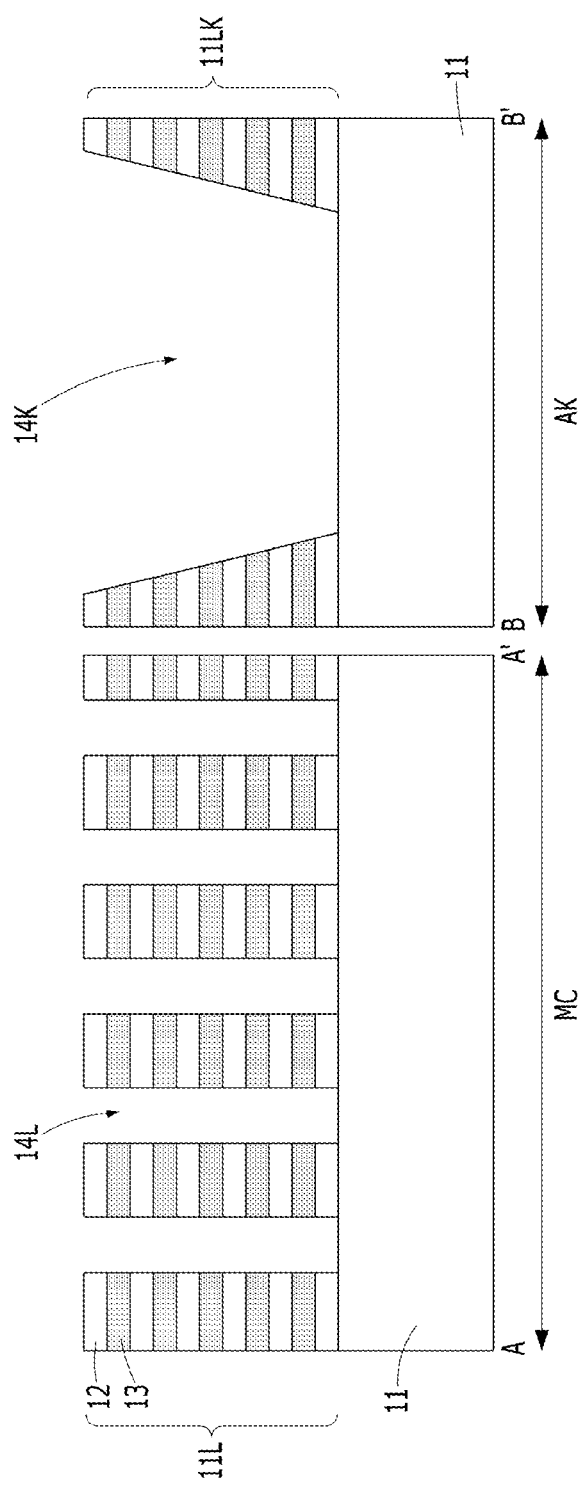
Figure 4D:
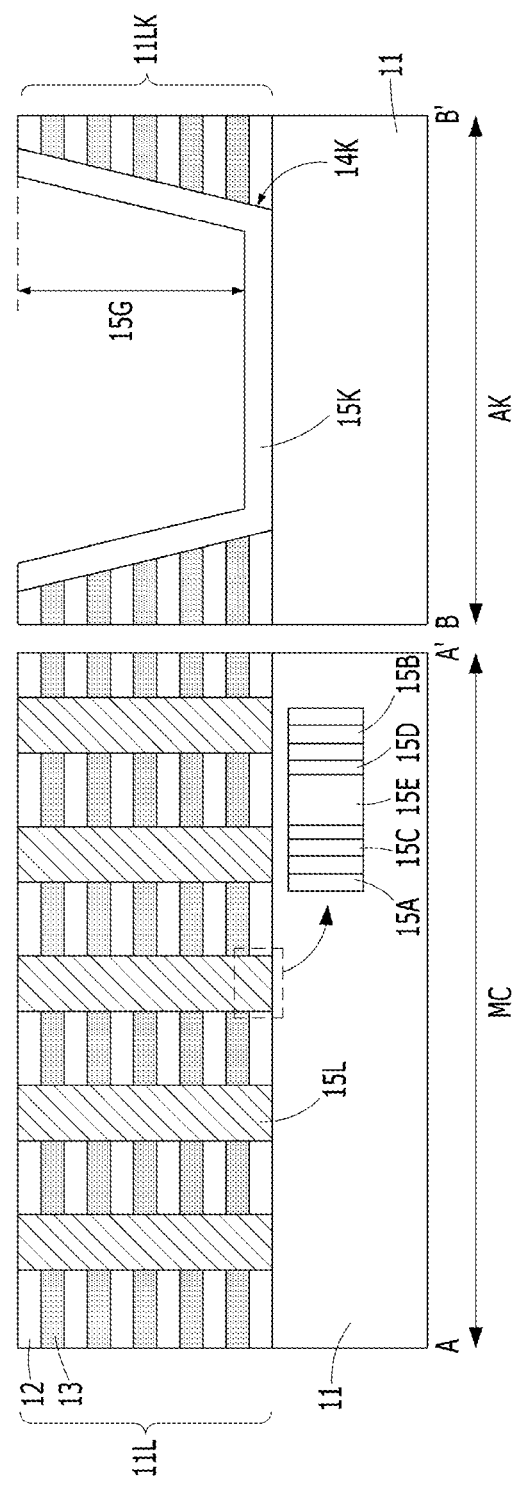

Referring to FIG. 4D, each of the lower and upper pillar structures 213L and 213U may include a blocking layer, a charge storage layer, a tunnel dielectric layer, a channel layer and a core dielectric layer. The lower pillar structure 213L and the upper pillar structure 213U may be referred to as a "lower channel structure" and an "upper channel structure," respectively.

A hard mask layer 204 may be formed on the upper memory cell stacks 211U and the upper pillar structure 213U.

The alignment key region AK may be disposed on a scribe lane. A dummy stack 212L and 212U may be formed on the substrate 201 of the alignment key region AK. The dummy stack 212L and 212U may have a structure in which a lower dummy stack 212L and an upper dummy stack 212U are stacked. Each of the lower and upper dummy stacks 212L and 212U may have a structure in which different dielectric layers, that is, a plurality of first dielectric layers 213 and a plurality of second dielectric layers 214, are alternately stacked. The hard mask layer 204 may be formed on the upper dummy stack 212U.

The lower dummy stack 212L may include a lower stepped alignment key 215, and a lower alignment key pattern 216 may be formed on the bottom and sidewalls of the lower stepped alignment key 215. The lower stepped alignment key 215 may have a trench shape, and the lower alignment key pattern 216 may have a 'U' shape. A part of the upper dummy stack 212U may fill the interior of the lower stepped alignment key 215. The upper dummy stack 212U may include an upper stepped alignment key 217. The upper stepped alignment key 217 propagate upwards from the lower stepped alignment key 215. In other words, the upper stepped alignment key 217 may be formed when a plurality of alternating layers are sequentially deposited within an opening corresponding to the lower stepped alignment key 215, and the upper stepped alignment key 217 may be include a notch, or recess portion RP. The location of the center of the recess portion RP may correspond to the center of lower stepped alignment key 215, so that the recess portion RP can be relied upon for accurately aligning upper pillar structures 213U with lower pillar structures 213L.

A plurality of overlay measurement recess portion RP may be formed by the lower stepped alignment key 215 and the upper stepped alignment key 217.

The upper dummy stack 212U may include a flat portion FP and a recess portion RP. The flat portion FP may be flat, and the recess portion RP may be recessed from the flat portion FP. The recess portion RP may include a sloped sidewall and a bottom surface. The bottom surface of the recess portion RP may be pointed or flat. The difference in height between the flat portion FP and the recess portion RP may be result from forming alternating layers in the lower stepped alignment key 215. Consequently, the upper stepped alignment key 217 may be induced from, or effectively caused by, the lower stepped alignment key 215.

FIGS. 3A to 3K are plan views that illustrate a method for fabricating a vertical semiconductor device in accordance with an embodiment. FIGS. 4A to 4K are cross-sectional views of the vertical semiconductor device taken along A-A' and B-B' lines illustrated in FIGS. 3A to 3K.

Figure 3A:
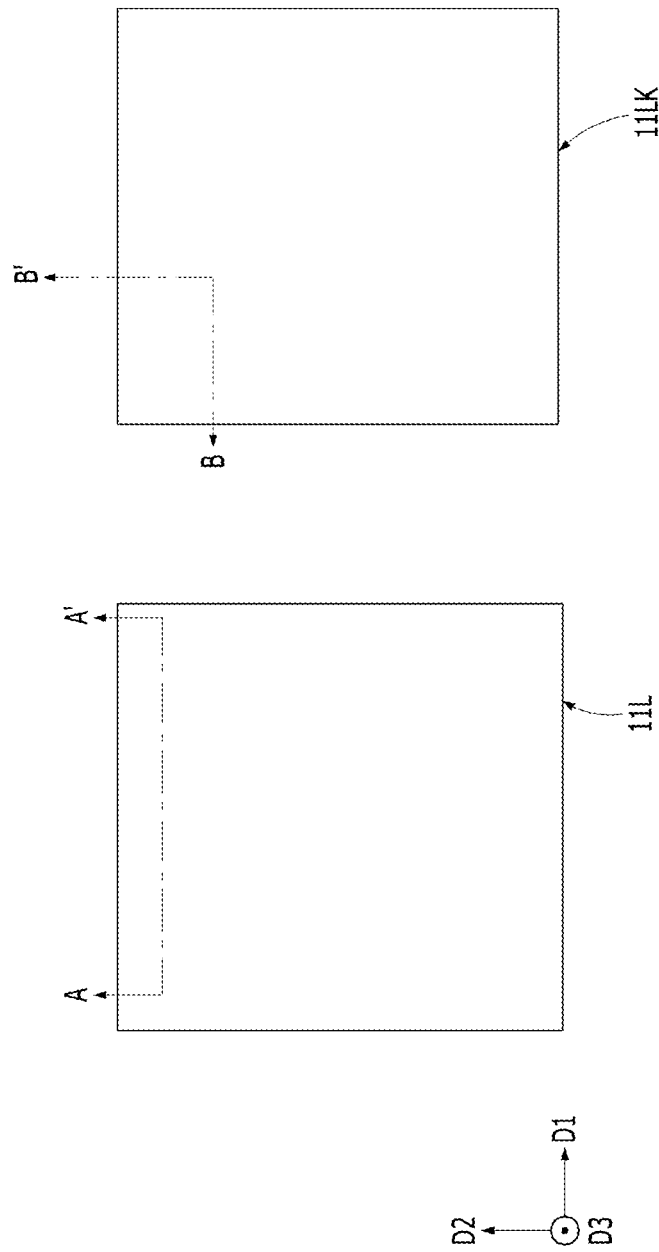

As illustrated in FIGS. 3A and 4A, a lower alternating stack 11L may be formed on a substrate 11. The substrate 11 may be a material suitable for semiconductor processing. The substrate 11 may include a semiconductor substrate. For example, the substrate 11 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination of multiple materials, or multiple discrete material layers. The substrate 11 may include additional semiconductor materials, such as germanium. The substrate 11 may include an III/V-group semiconductor substrate, for example, a chemical compound semiconductor substrate such as a gallium arsenide (GaAs). The substrate 11 may include a Silicon-On-Insulator (SOI) substrate. The substrate 11 may include a memory cell region MC and an alignment key region AK.

The lower alternating stack 11L may have a structure in which a first material layer and a second material layer are alternately stacked. The first material layer may include a first material, and the second material layer may include a second material. The first and second materials may be different materials. Each of the first and second material layers may include a dielectric layer 12 and a sacrificial layer 13. The dielectric layer 12 may include a dielectric material, and the sacrificial layer 13 may include a sacrificial material. The sacrificial material may refer to a material that is removed in a subsequent process. The dielectric layer 12 may include at least one dielectric material of, for example, silicon oxide, silicon nitride, silicon oxynitride, a spin-on dielectric material, dielectric metal oxide, silicate and dielectric metal oxynitride.

The sacrificial layer 13 may include a sacrificial material that can be selectively removed with respect to the dielectric layer 12. Herein, the sacrificial layer 13 may be selectively removed with respect to the dielectric layer 12. The ratio of the removal rate of the sacrificial layer 13 to the removal rate of the dielectric layer 12 may be referred to as an etch selectivity of the removal process of the sacrificial layer 13 with respect to the dielectric layer 12. The sacrificial layer 13 may include a dielectric material. The sacrificial layer 13 may be replaced with a conductive material in a subsequent process. For example, the sacrificial layer 13 may be replaced with a gate electrode or a word line of a vertical NAND device.

The sacrificial layer 13 may include silicon nitride, amorphous silicon or polysilicon. In some embodiments, the sacrificial layer 13 may include silicon nitride. In one specific embodiment, the dielectric layer 12 may include silicon oxide, and the sacrificial layer 13 may include silicon nitride. The dielectric layer 12 and the sacrificial layer 13 may be deposited by chemical vapor deposition (CVD) or atomic layer deposition (ALD). The lowermost and uppermost layers of the lower alternating stack 11L may be a dielectric layer 12. The dielectric layer 12 and the sacrificial layer 13 may have the same thickness.

A lower alignment key stack 11LK may be formed on the substrate 11 of the alignment key region AK in the same manner as the lower alternating stack 11L. The lower alignment key stack 11LK may refer to a part in which the lower alternating stack 11L formed in the memory cell region MC extends into the alignment key region AK. The lower alignment key stack 11LK may have a structure in which the dielectric layer 12 and the sacrificial layer 13 are alternately stacked in the same manner as the lower alternating stack 11L. The lower alignment key stack 11LK may be referred to as a "lower dummy stack".

As illustrated in FIGS. 3B and 4B, a first mask layer 11LM may be formed. The first mask layer 11LM may include a photoresist pattern. A plurality of first openings 11LV and a plurality of alignment key openings 11KL may be defined in the first mask layer 11LM. The first openings 11LV may be formed in the memory cell regions MC. The alignment key openings 11KL may be formed in the alignment key region AK. Each of the first openings 11LV may have a smaller size than each of the alignment key openings 11KL. In an embodiment, the size of the first opening 11LV may be much smaller than that of the alignment key opening 11KL. For example, the first opening 11LV may have a size of 50 nm×50 nm (i.e., 0.05 μm×0.05 μm), and the alignment key opening 11KL may have a size of 1 μm×1 μm. In such an embodiment, side lengths of the alignment key opening 11KL are approximately 20 times larger than sides of the first opening 11LV.

Figure 3C:
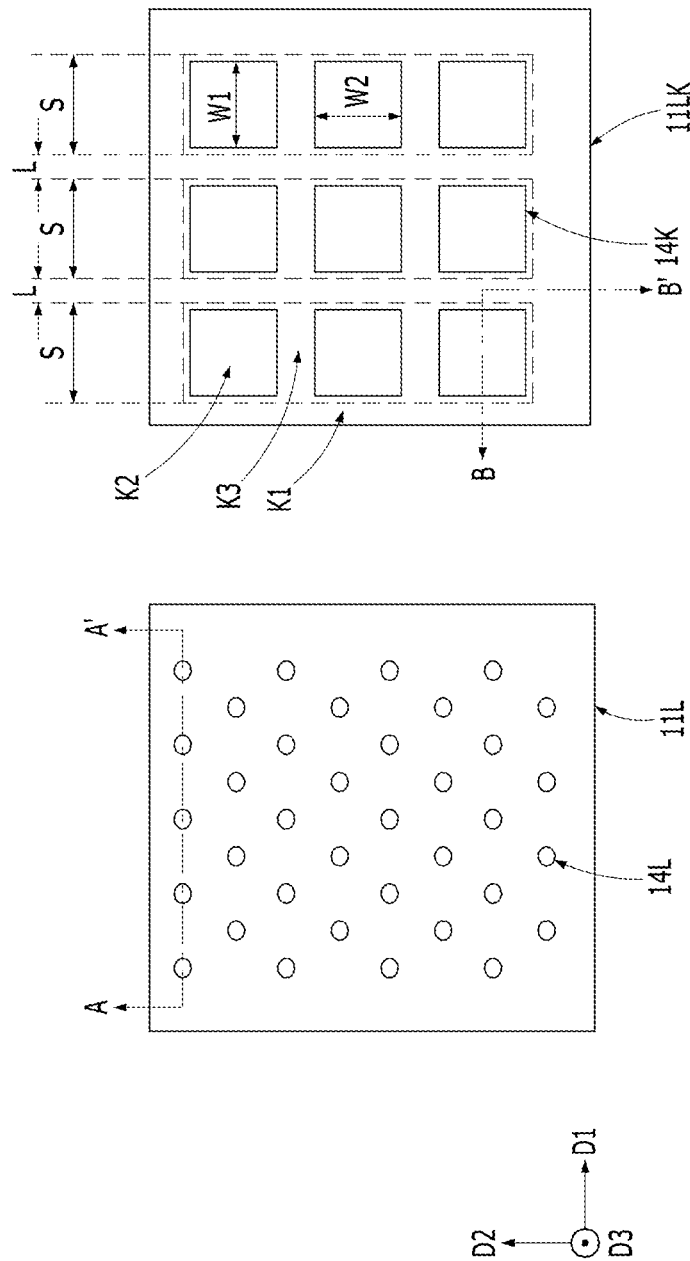

The lower alternating stack 11L and the lower alignment key stack 11LK may be etched using the first mask layer 11LM. Accordingly, as illustrated in FIGS. 3C and 4C, a plurality of lower holes 14L and a plurality of lower alignment keys 14K may be formed. After the lower holes 14L and the lower alignment keys 14K are formed, the first mask layer 11LM may be removed.

Referring to FIGS. 3C and 4C, the lower holes 14L may be formed in the lower alternating stack 11L of the memory cell region MC. In order to form the lower holes 14L, a part of the lower alternating stack 11L may be etched using the first mask layer 11LM. The bottom surfaces of the lower holes 14L may expose the surface of the substrate 11. Each of the lower holes 14L may include a vertical hole. A plurality of lower holes 14L may be arranged as an array of holes. In one embodiment, the plurality of lower holes 14L may be arrayed in a zigzag pattern. The lower holes 14L may have uniform sizes. The side walls of the lower holes 14L may have vertical profiles. In some embodiments, the side walls of the lower holes 14L may have inclined or angled profiles.

During an etch process of forming the lower holes 14L, the lower alignment keys 14K may be formed by etching the lower alignment key stack 11LK of the alignment key region AK. The side walls of the lower alignment keys 14K may have inclined profiles. In other words, side walls of the lower alignment keys 14K may be disposed at an angle relative to the primary plane of substrate 11.

Widths of the lower holes 14L in a first direction D1 may be equal to widths of the lower holes 14L in a second direction D2. Widths W1 of the lower alignment keys 14K in the first direction D1 may be equal to widths W2 of the lower alignment keys 14K in the second direction D2. In other words, the lower holes 14L may have a circular shape and the alignment keys 14K may have a square shape, although embodiments are not limited to that shape. In another embodiment, the lower holes 14L and the alignment keys 14K may have a square shape.

In the embodiment shown in FIG. 3C, the lower alignment keys 14K are arrayed in a two-dimensional grid bordered by a closed portion K1, opened portions K2 and sub-closed portions K3. The lower alignment keys 14K may be present in the form of a line and space pattern defined by lines L separated by spaces S that are indicated by dashed lines. The dimensions of FIG. 3C are not necessarily to scale-ratios of the length to width of the spaces can be, for example, 50:1 or more.

In the line and space-shaped pattern, the line shape may include the closed portion K1, and the space shape may be divided into the sub-closed portions K3 and the opened portions K2. The layout between the opened portions K2 and the closed portions K1 and K3 may be formed at a ratio of 10% to 90%. The cross sections of the opened portions K2 may have square shapes. Specifically, the lower alignment key 14K may be formed in the line-and-space shape, and divided into the opened portions K2 having square shapes.

A ratio between the opened portions K2 and the closed portions K1 and K3 may be, for example, 10% to 90%. In other embodiments, the lower holes 14L may be circular shape and the alignment keys 14K may be square shape. The lower holes 14L may be arranged in a circular hole array, and the lower alignment keys 14K may be arranged in a square hole array. The size of the square hole may be larger than that of the circular hole. In other embodiments, the lower holes 14L may be arranged in a first circular hole array, and the lower alignment keys 14K may be arranged in a second circular hole array. The size of the second circular hole may be larger than that of the first circular hole.

The lower hole 14L may have a substantially smaller size than the lower alignment key 14K. For example, the lower hole 14L may have a size of 50 nm×50 nm (0.05 µm×0.05 µm), and the lower alignment key 14K may have a size of 1 µm×1 µm. The lower alignment key 14K may be approximately 20 times larger than the lower hole 14L. In various embodiments, a width and length of the lower alignment key 14K may be less than or equal to 1 µm, respectively.

As such, the size of the lower alignment key 14K may be controlled to form a stepped profile for measuring an overlay in a subsequent process, and may not punch-through the substrate 11 during the etch process. Since the punch-through does not occur, cracks and arcing defects can be prevented by embodiments of the present application.

As a comparative example, the size of the lower alignment key 14K may be increased to have an elongated rectangle shape, for example, 1 µm×50 µm (or 50 µm×1 µm). While a larger trench size facilitates measuring the overlay in a subsequent process, there is a higher probability that punch-through occurs during the etch process.

After the lower holes 14L and the lower alignment keys 14K are formed, the first mask layer 11LM may be removed.

Figure 3D:
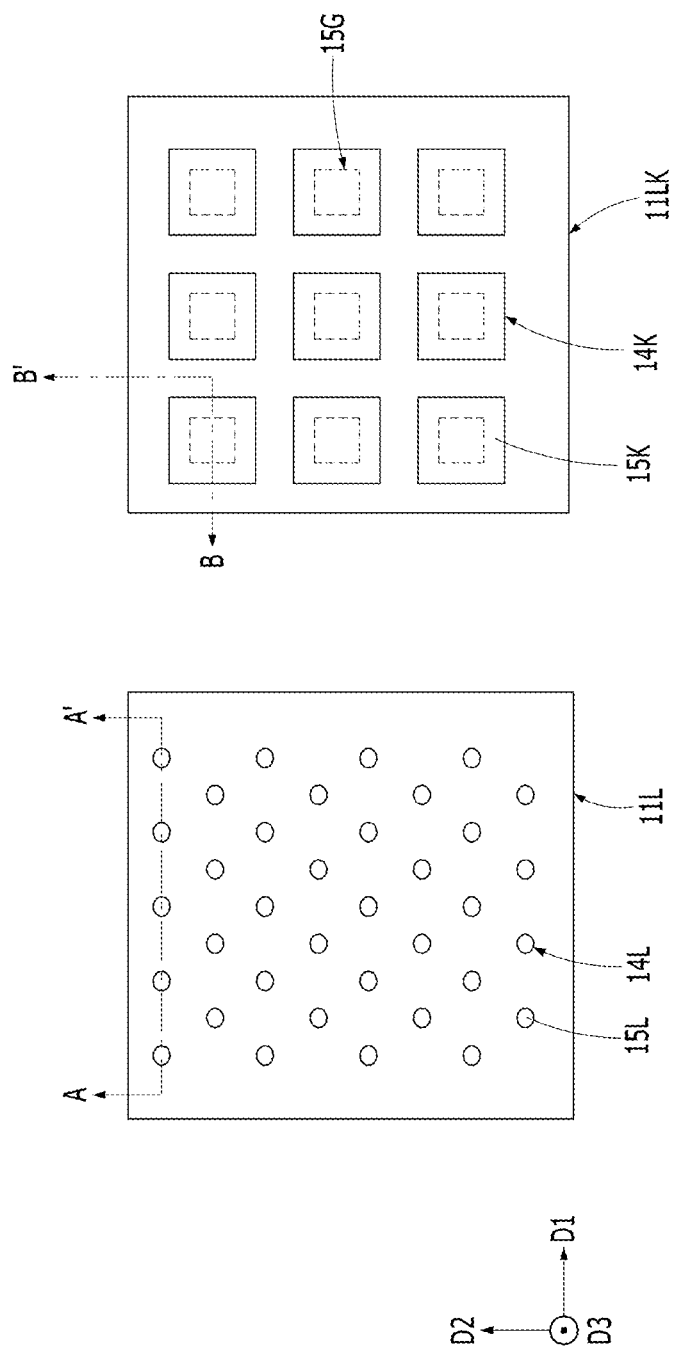

As illustrated in FIGS. 3D and 4D, a lower pillar structure 15L may be formed. The lower pillar structure 15L may fill the lower holes 14L. The lower pillar structure 15L may include a plurality of layers, and the top surface of the lower pillar structure 15L may be at the same level as the top surface of the lower alternating stack 11L. The lower pillar structure 15L may have a pillar shape in which a blocking layer 15A, a charge storage layer 15B, a tunnel dielectric layer 15C, a channel layer 15D and a core dielectric layer 15E are sequentially formed. The blocking layer 15A may include silicon oxide or aluminum oxide. The charge storage layer 15B may include silicon nitride. The tunnel dielectric layer 15C may include silicon oxide. The channel layer 15D may include a silicon layer. The channel layer 15D may include a doped silicon layer. The core dielectric layer 15E may include silicon oxide. The channel layer 15D may have a hollow cylindrical shape, and the core dielectric layer 15E may fill the hollow core of the cylinder of the channel layer 15D.

While the lower pillar structure 15L is formed, a lower alignment key pattern 15K may be formed in the lower alignment key stack 11LK of the alignment key region AK. The lower alignment key pattern 15K may be formed of the same material as the lower pillar structure 15L. The lower alignment key pattern 15K may have a different shape from the lower pillar structure 15L. The lower pillar structure 15L may be a circle-shaped pillar, and the lower alignment key pattern 15K may have a cylindrical shape or a U shaped profile. The lower alignment key pattern 15K may not fill the lower alignment key 14K. In other words, the lower alignment key pattern 15K may cover the bottom surface and the side walls of the lower alignment key 14K.

After the lower alignment key pattern 15K is formed, a lower step 15G may be provided to the inside of the lower alignment key 14K. The lower step 15G, the lower alignment key 14K and the lower alignment key pattern 15K may provide a lower step or an overlay measurement step. In other words, the structure illustrated in FIG. 4D shows lower step 15G having a depth dimension, and the depth of lower step 15G propagates upwards when subsequent layers are formed so that a depression having a depth is visible on a surface of the device, and that depression can be used for alignment.

The lower alignment key 14K may be referred to as a "lower stepped alignment key". The lower step 15G may be defined by a difference in height between the uppermost surface of the lower alignment key stack 11LK and the exposed surface of the lower alignment key pattern 15K. Accordingly, the lower alignment key 14K may be the lower stepped alignment key including the lower step 15G. Each of the lower step 15G and the lower alignment key 14K may have a trench shape.

Figure 3E:
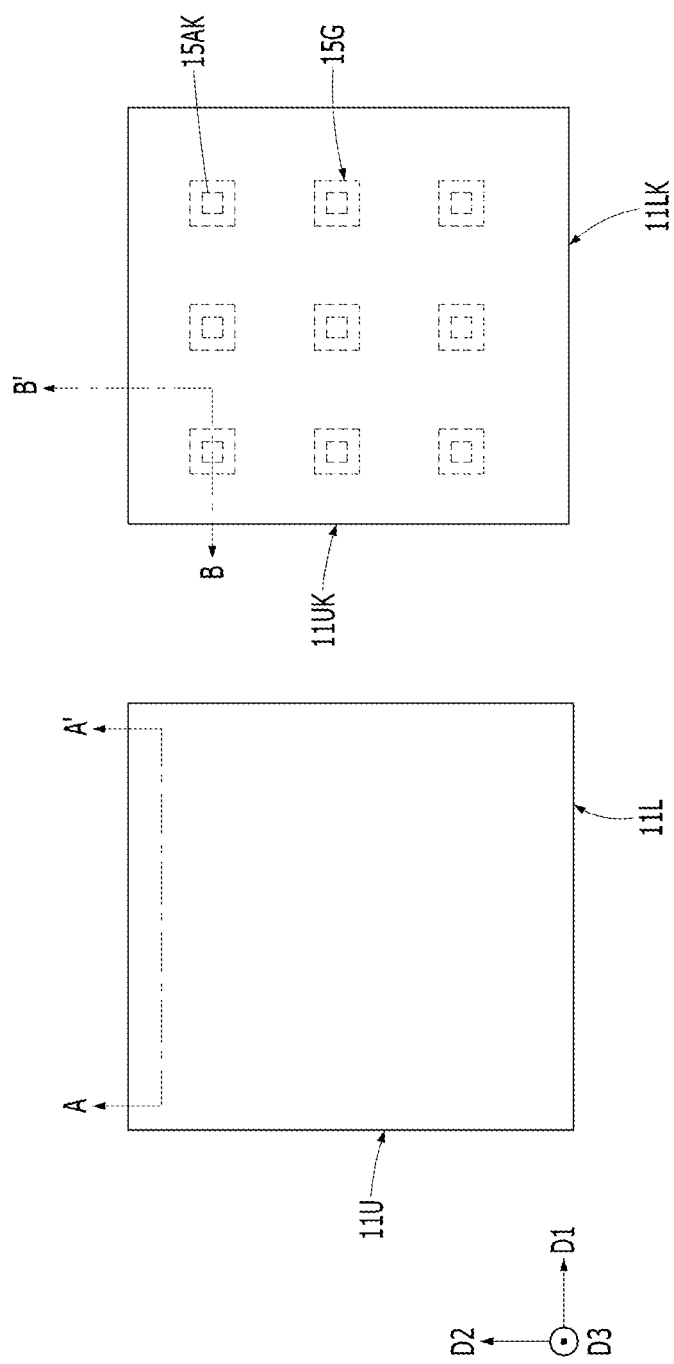

As illustrated in FIGS. 3E and 4E, an upper alternating stack 11U may be formed on the lower alternating stack 11L and the lower pillar structure 15L. The upper alternating stack 11U may be the same as the lower alternating stack 11L. The upper alternating stack 11U may have a structure in which the dielectric layer 12 and the sacrificial layer 13 are alternately stacked. The dielectric layer 12 may include a dielectric material, and the sacrificial layer 13 may include a sacrificial material. The sacrificial material may refer to a material that is removed in a subsequent process. The dielectric layer 12 may include at least one dielectric material of silicon oxide, silicon nitride, silicon oxynitride, a spin-on dielectric material, dielectric metal oxide, silicate and dielectric metal oxynitride. The sacrificial layer 13 may include a sacrificial material that can be selectively removed with respect to the dielectric layer 12. The sacrificial layer 13 may be selectively removed with respect to the dielectric layer 12.

A ratio of removal speeds of the sacrificial layer 13 and the dielectric layer 12 may be referred to as a selectivity of a removal process of the sacrificial layer 13 with respect to the dielectric layer 12. The sacrificial layer 13 may include a dielectric material. The sacrificial layer 13 may be replaced with a conductive material in a subsequent process. For example, the sacrificial layer 13 may be replaced with a gate electrode or a word line of a vertical NAND device. The sacrificial layer 13 may include silicon nitride, amorphous silicon or polysilicon. In some embodiments, the sacrificial layer 13 may include silicon nitride. In an embodiment, the dielectric layer 12 may include silicon oxide, and the sacrificial layer 13 may include silicon nitride. The dielectric layer 12 may be deposited by CVD or ALD. The sacrificial layer 13 may be deposited by CVD or ALD. The lowermost and uppermost layers of the lower alternating stack 11L may be the dielectric layer 12. In an embodiment, the dielectric layer 12 and the sacrificial layer 13 may have the same thickness.

An upper alignment key stack 11UK may be formed on the lower alignment key pattern 15K and the lower alignment key stack 11LK of the alignment key region AK in the same manner as the upper alternating stack 11U. The upper alignment key stack 11UK may refer to a part of the device in which the upper alternating stack 11U formed in the memory cell region MC extends into the alignment key region AK. The upper alignment key stack 11UK may have a structure in which the dielectric layer 12 and the sacrificial layer 13 are alternately stacked in the same manner as the upper alternating stack 11U. The upper alignment key stack 11UK may be referred to as an "upper dummy stack".

A part of the upper alignment key stack 11UK may cover the lower alignment key pattern 15K. For example, a part of the upper alignment key stack 11UK may fill the lower step 15G. The upper alignment key stack 11UK may include a stack of the dielectric layer 12 and the sacrificial layer 13. For example, when the upper alignment key stack 11UK has a structure in which five dielectric layers 12 and five sacrificial layers 13 are alternately stacked, three dielectric layers 12 and three sacrificial layers 13 may fill the lower step 15G, and the other two dielectric layers 12 and the other two sacrificial layers 13 may not fill the lower step 15G. The numbers of the dielectric layers 12 and the sacrificial layers 13 which fill the lower step 15G may vary between different embodiments depending on the depth of the lower step 15G and the thickness of the layers.

The upper alignment key stack 11UK may include an upper step 15AK above the lower step 15G. The upper alignment key stack 11UK may include a flat portion FP and a recess portion RP that is lower in height than the flat portion FP. The recess portion RP may be a trench or depth variation in an otherwise flat portion FP of an upper surface of the device. The upper step 15AK may be provided by a difference in height between the flat portion FP and the recess portion RP.

As described above, the upper step 15AK may be induced by, or result from, filling the lower step 15G.

Figure 3F:
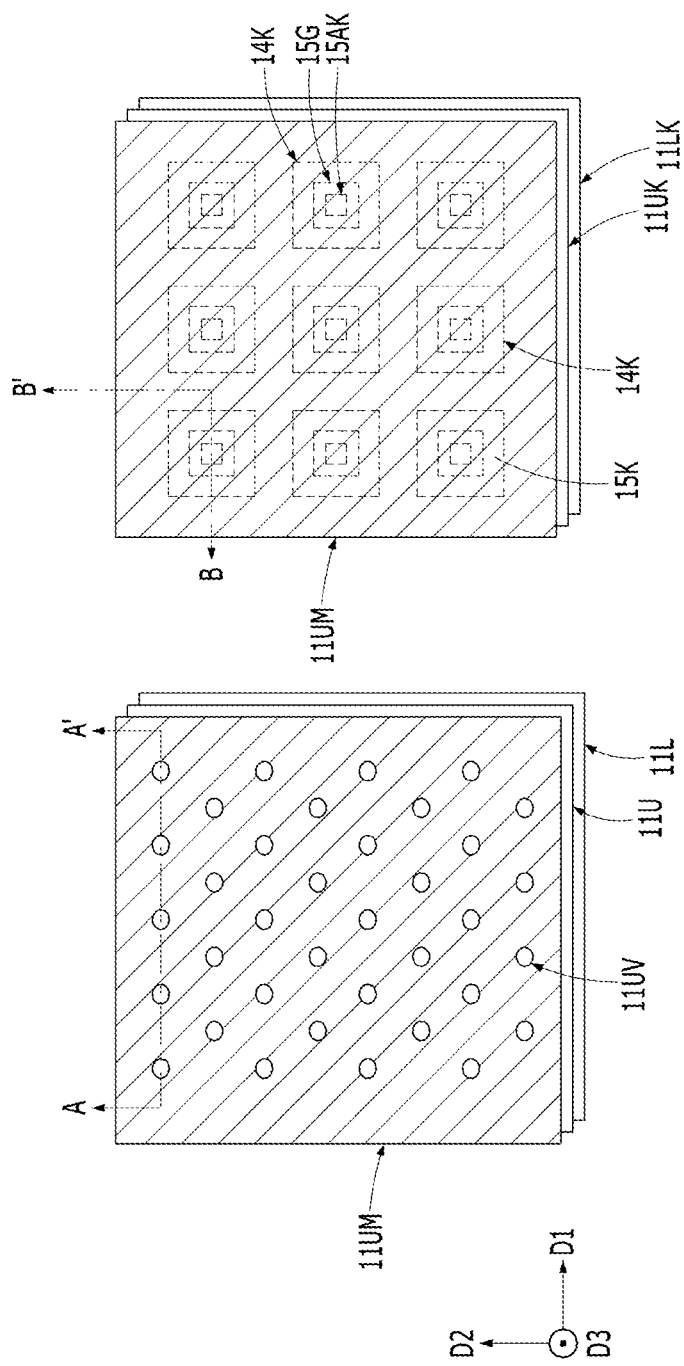

As illustrated in FIGS. 3F and 4F, a second mask layer 11UM may be formed. The second mask layer 11UM may include a photoresist pattern. A plurality of second openings 11UV may be defined in the second mask layer 11UM. The second openings 11UV may be formed in the memory cell region MC. An overlay alignment for the second mask layer 11UM may use features 14K, 15K and 15G. Each of the second openings 11UV may have a size of 50 nm×50 nm (0.05 μm×0.05 μm), and the second opening 11UV and the first opening 11LV may have the same size. An alignment key which can be accurately detected for accurate overlay control of the second mask layer 11UM. In the present embodiment, alignment may be accomplished using features 14K, 15K and 15G.

The second mask layer 11UM may include positive photoresist or negative photoresist.

The upper alternating stack 11U may be etched using the second mask layer 11UM. Accordingly, as illustrated in FIGS. 3G and 4G, a plurality of upper holes 14U may be formed.

Figure 4G:
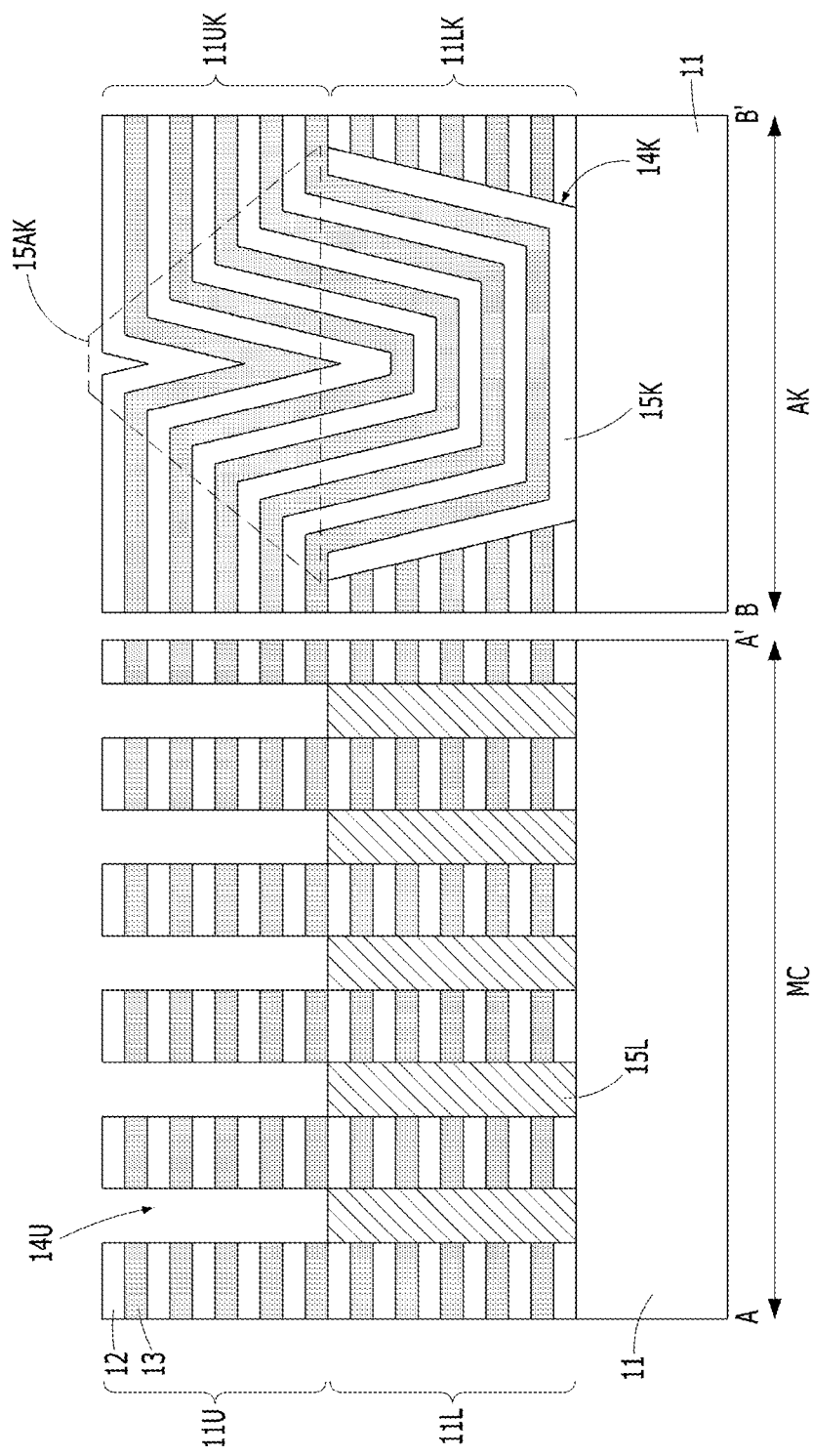

Referring to FIGS. 3G and 4G, the upper holes 14U may be formed in the upper alternating stack 11U of the memory cell region MC. The bottom surfaces of the upper holes 14U may expose the surface of the lower pillar structure 15L. Each of the upper holes 14U may be a vertical hole. A plurality of upper holes 14U may be arrayed in a pattern. For example, the plurality of upper holes 14U may be arrayed in a zigzag pattern. The upper holes 14U may have uniform sizes. The side walls of the upper holes 14U may have vertical profiles. In some embodiments, the side walls of the upper holes 14U may have inclined profiles.

Figure 4H:
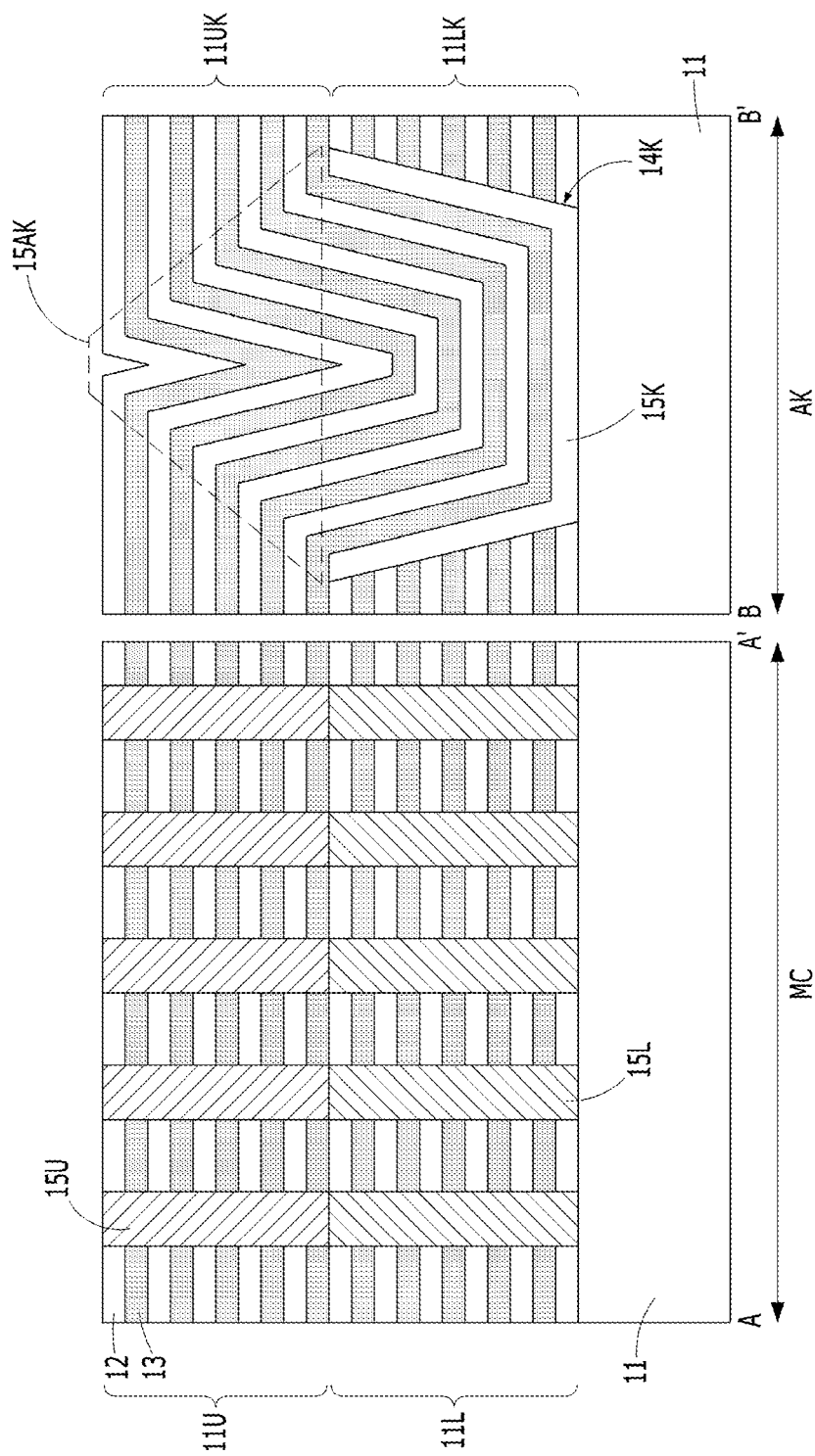

As illustrated in FIGS. 3H and 4H, an upper pillar structure 15U may be formed. The upper pillar structure 15U may fill the upper holes 14U. The upper pillar structure 15U may include a plurality of layers, and the top surface of the upper pillar structure 15U may be at the same level as the top surface of the upper alternating stack 11U. The upper pillar structure 15U may have the same configuration as the lower pillar structure 15L. For example, the upper pillar structure 15U may have a pillar shape in which a blocking layer 15A, a charge storage layer 15B, a tunnel dielectric layer 15C, a channel layer 15D and a core dielectric layer 15E are sequentially formed.

The lower and upper pillar structures 15L and 15U may be vertically stacked on each other.

Figure 3I:
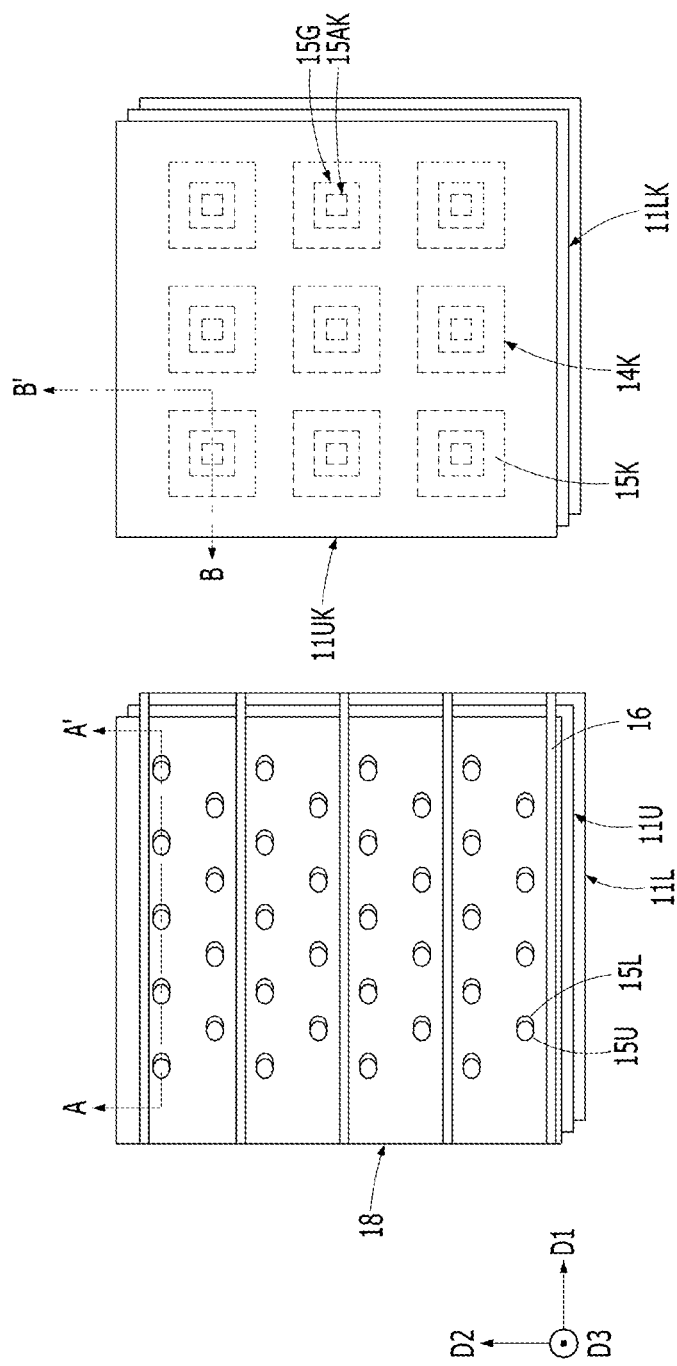
Figure 4I:
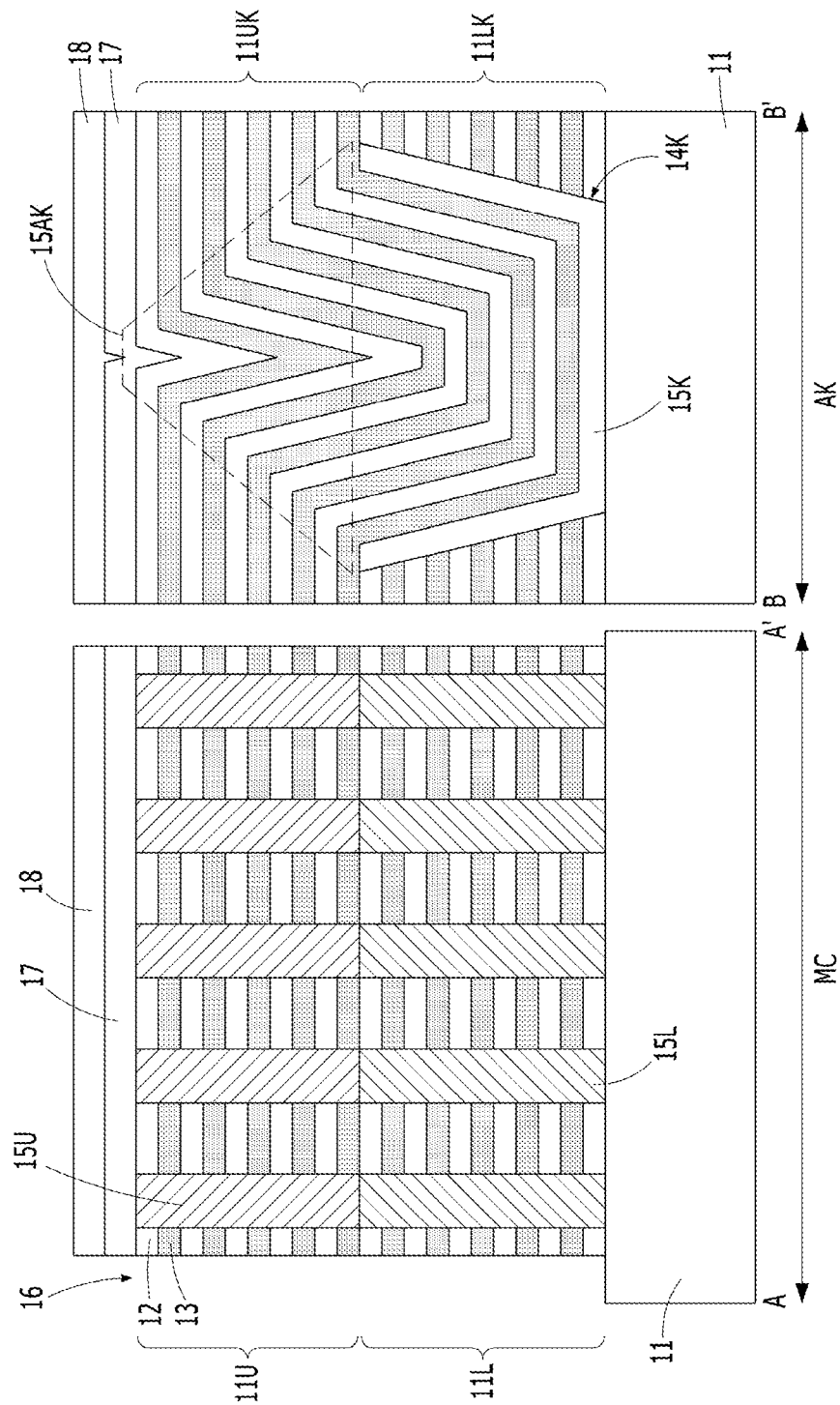

As illustrated in FIGS. 3I and 4I, a slit 16 may be formed. In order to form the slit 16, the upper and lower alternating stacks 11U and 11L may be sequentially etched. From a top view, the slit 16 may have a line shape elongating in any one direction, e.g., the first direction D1. The slit 16 may divide the memory cell region MC into block units. Each block may include 9 pillar structures in an array, but other embodiments are possible.

In order to form the slit 16, a hard mask layer 17 may be deposited across the surface of the structure of FIG. 3H, and then a slit mask 18 may be formed. When the slit mask 18 is formed, an overlay alignment may use the overlay elements 14K, 15K and 15G. An alignment key which is clearly identified in the lower portion is used for accurate overlay control of the slit mask 18. When an opaque material such as silicon and carbon is used as the hard mask layer 17, it is difficult to identify a lower alignment key. Accordingly, in an embodiment of the present disclosure, an alignment key signal may be secured using the recess portion RP caused by filling lower alignment key 14K.

Figure 3J:
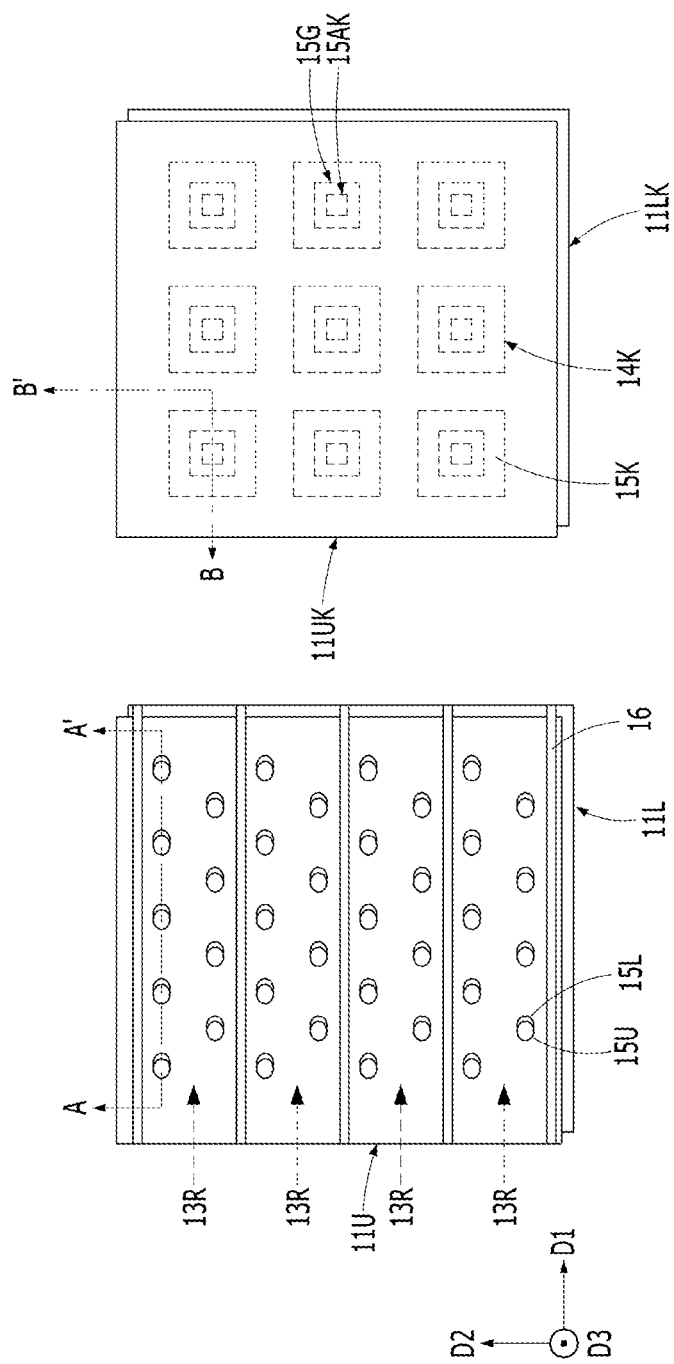
Figure 4J:
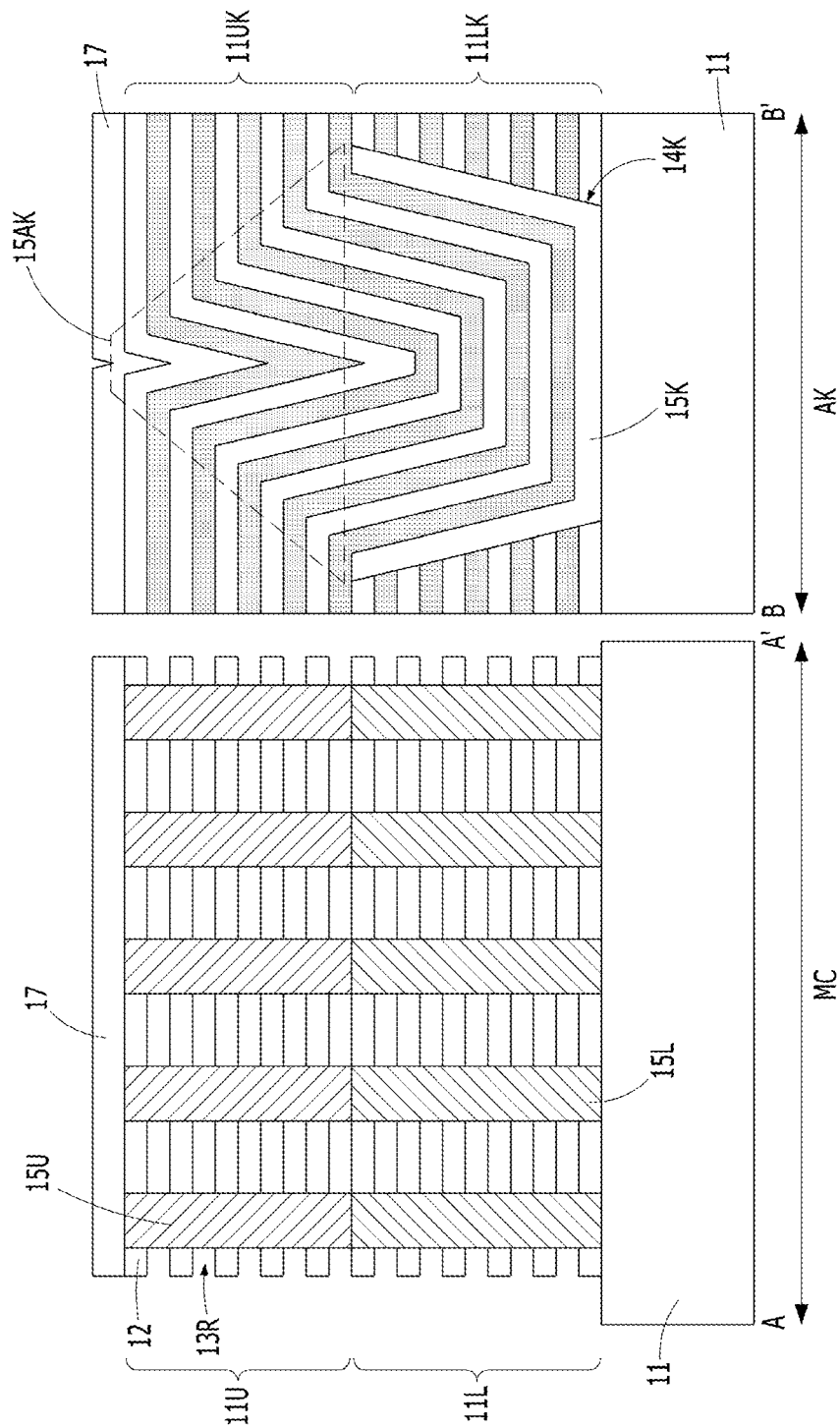

As illustrated in FIGS. 3J and 4J, the slit mask 18 may be removed, and then the sacrificial layer 13 may be selectively removed through the slit 16. Accordingly, a horizontal recess 13R may be formed between the dielectric layers 12. The horizontal recess 13R may partially expose the outer walls of the lower and upper pillar structures 15L and 15U.

Figure 3K:
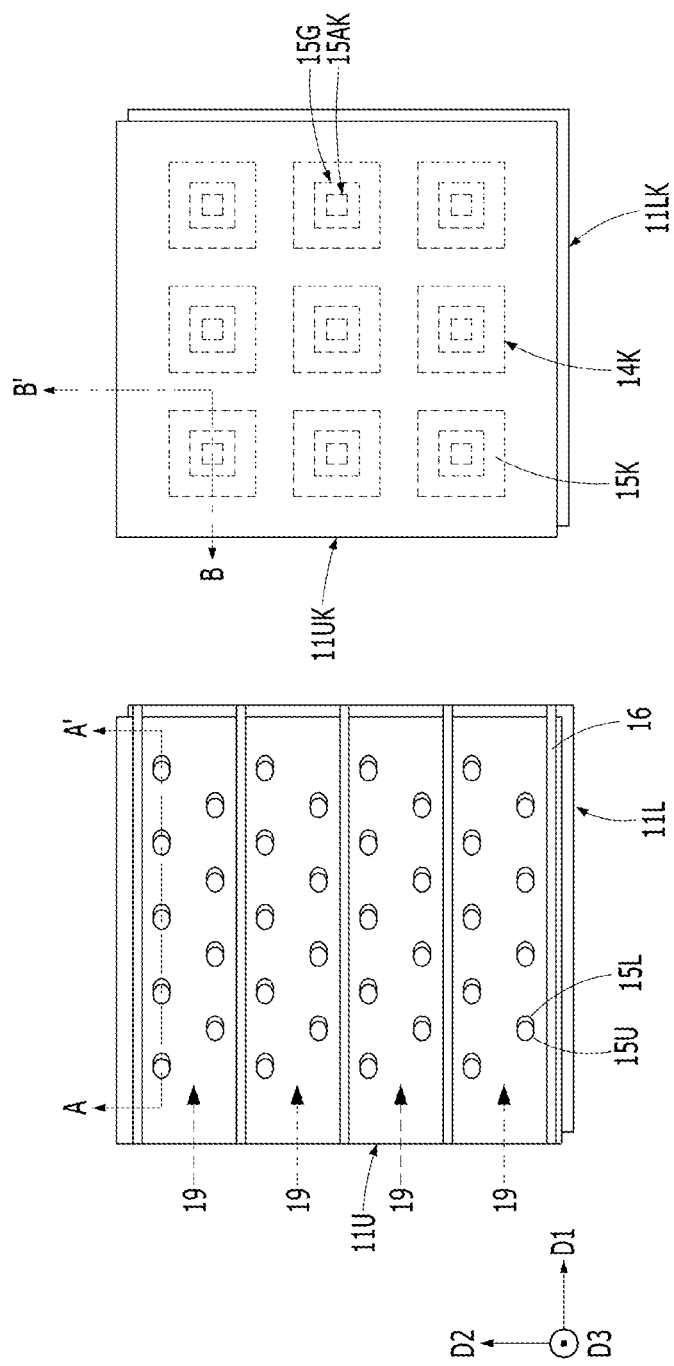

As illustrated in FIGS. 3K and 4K, a gate electrode 19 may be formed to fill the horizontal recess 13R. The gate electrode 19 may include a low-resistance material. The gate electrode 19 may include a metal-based material. The gate electrode 19 may include a metal, metal silicide, metal nitride or combinations thereof. For example, the metal may include nickel, cobalt, platinum, titanium, tantalum or tungsten. The metal silicide may include nickel silicide, cobalt silicide, platinum silicide, titanium silicide, tantalum silicide or tungsten silicide. The gate electrode 19 may further include a barrier material (not illustrated). The barrier material may include metal nitride. For example, the barrier material may include titanium nitride (TiN).

As the gate electrode 19 is formed, memory cell stacks 11L' and 11U' may be formed on the substrate 11 of the memory cell region MC. The memory cell stacks 11L' and 11U' may have structures in which the dielectric layers 12 and the gate electrodes 19 are alternately stacked.

According to the above-described embodiments, a stepped alignment key using a hole array is formed, thereby preventing cracks and arcing defects associated with conventional alignment keys in a scribe lane. An alignment key signal according to an embodiment of the present application may be detected by detecting a recess portion RP disposed in one or more layer that fills an opening. The recess portion RP may be detected in an alignment process. In addition, it is possible to reduce wafer defects.

Further, the alignment accuracy of the alignment key can be improved, and overlay can be controlled by minimizing the alignment key signal variation between wafers during wafer alignment.

While the present disclosure has been described with respect to the specific embodiments, it should be noted that the embodiments are for describing, not limiting, the present disclosure. Further, it should be noted that the present disclosure may be achieved in various ways through substitution, change, and modification, by those skilled in the art without departing from the scope of the present disclosure as defined by the following claims.

What is claimed is:

1. A method for fabricating a vertical semiconductor device comprising:
   preparing a substrate including a first region and a second region;
   forming a lower alternating stack on the substrate;
   etching the lower alternating stack to form a lower opening in the second region;
   forming an upper alternating stack on the lower opening and the lower alternating stack to form a recess portion caused by filling the lower opening in the second region;
   forming a mask layer on the upper alternating stack by using the recess portion as an alignment key; and
   etching the upper alternating stack by using the mask layer as a barrier to form a pattern in the first region.

2. The method of claim 1, wherein the etching of the lower alternating stack to form the lower opening in the second region comprises:
   forming a mask material on the lower alternating stack;
   patterning the mask material to form an alignment key opening corresponding to the lower opening in the mask material; and
   etching the lower alternating stack using the mask material as an etch barrier to form the lower opening.

3. The method of claim 2, wherein the lower opening is an opening in the lower alternating stack that extends through all layers of the lower alternating stack.

4. The method of claim 3, wherein the lower opening is part of a pattern of openings that are spaced apart from one another in two dimensions.

5. The method of claim 3, wherein the openings occupy about 10% of the surface area of the pattern of openings.

6. The method of claim 3, wherein a width dimension of the openings is the same as a length dimension of the openings.

7. The method of claim 2, wherein the lower opening is a line and space-shaped pattern, and the line shape of the line and space-shaped pattern includes a closed portion, and the space shape of the line and space-shaped pattern is divided into a plurality of sub-closed portions and a plurality of opened portions.

8. The method of claim 1, wherein the mask material includes positive photoresist or negative photoresist.

9. The method of claim 1, wherein etching the lower alternating stack comprises forming a lower hole in the first region while forming the lower opening in the second region.

10. The method of claim 9, further comprising filling the lower hole with a lower pillar structure.

11. The method of claim 10, wherein etching the upper alternating stack using the mask layer as the etch barrier comprises:
    forming an upper hole that exposes a top surface of the lower pillar structure; and
    forming an upper pillar structure that fills the upper hole.

12. A method for fabricating a vertical semiconductor device comprising:
    preparing a substrate including a first region and a second region;
    forming a lower alternating stack in which first dielectric layers and first sacrificial layers are alternately stacked on the substrate;
    etching the lower alternating stack to form a lower hole located in the first region and a lower opening located in the second region;
    forming a lower pillar structure in the lower hole;
    forming an upper alternating stack in which second dielectric layers and second sacrificial layers are alternately stacked on the lower opening to form a recess portion caused by filling the lower opening;
    forming a mask layer on the upper alternating stack using the lower opening;
    etching the upper alternating stack using the mask layer as a barrier to form an upper hole that exposes the lower pillar structure in the first region;
    forming an upper pillar structure in the upper hole; and
    replacing the first and second sacrificial layers with gate electrodes.

13. The method of claim 12, wherein etching the lower alternating stack to form the lower hole located in the first region and the lower opening located in the second region comprises:
    forming a mask material on the lower alternating stack;
    defining a mask opening corresponding to the lower opening and an alignment key opening corresponding to the lower opening in the mask material; and
    etching the lower alternating stack using the mask material as an etch barrier to form the lower hole and the lower opening.

14. The method of claim 13, wherein the lower opening is an opening in the lower alternating stack that extends through all layers of the lower alternating stack.

15. The method of claim 14, wherein the lower opening is part of a pattern of lower openings in which the lower openings occupy about 10% of a surface area of the pattern.

16. The method of claim 14, wherein cross sections of the opened portions have square shapes.

17. The method of claim 14, wherein the pattern includes an array of the lower openings spaced apart from one another in two dimensions.

* * * * *